United States Patent
Brace et al.

(10) Patent No.: US 10,635,550 B2
(45) Date of Patent: Apr. 28, 2020

(54) MEMORY EVENT MITIGATION IN REDUNDANT SOFTWARE INSTALLATIONS

(71) Applicant: GE Aviation Systems LLC, Grand Rapids, MI (US)

(72) Inventors: Terrell Michael Brace, Ada, MI (US); Troy Stephen Brown, Kalamazoo, MI (US); Gregory Reed Sykes, Caledonia, MI (US)

(73) Assignee: GE Aviation Systems LLC, Grand Rapids, MI (US)

( * ) Notice: Subject to any disclaimer, the term of this patent is extended or adjusted under 35 U.S.C. 154(b) by 125 days.

(21) Appl. No.: 15/836,672

(22) Filed: Dec. 8, 2017

(65) Prior Publication Data
US 2019/0179718 A1    Jun. 13, 2019

(51) Int. Cl.
*G06F 11/16* (2006.01)
*G06F 9/54* (2006.01)
(Continued)

(52) U.S. Cl.
CPC .......... *G06F 11/167* (2013.01); *G06F 9/54* (2013.01); *G06F 9/542* (2013.01); *G06F 11/0715* (2013.01); *G06F 11/1048* (2013.01); *G06F 11/14* (2013.01); *G06F 11/1479* (2013.01); *G06F 11/16* (2013.01); *G06F 11/1629* (2013.01); *G11C 29/52* (2013.01); *G11C 29/74* (2013.01)

(58) Field of Classification Search
CPC .......... G06F 11/079; G06F 11/0751; G06F 11/0793; G06F 11/0709; G06F 11/0772; G06F 11/3447; G06F 11/3457; G06F 11/3476; G06F 11/3668
See application file for complete search history.

(56) References Cited

U.S. PATENT DOCUMENTS 6,854,075 B2   2/2005   Mukherjee et al.
6,883,121 B1   4/2005   Jensen et al.
(Continued)

OTHER PUBLICATIONS

European Invitation pursuant to Rule 63(1) EPC Report for European Patent Application No. 18209841.8 dated May 22, 2019, 4 pages.
(Continued)

Primary Examiner — Nadeem Iqbal
(74) Attorney, Agent, or Firm — Amin, Turocy & Watson LLP

(57) ABSTRACT

Systems and techniques for memory event mitigation in redundant software installations are presented. A system can initiate an event executed by a first software application and a second software application that corresponds to the first software application. First data associated with the first software application can be stored in a first data store and second data associated with the second software application can be stored in a second data store. The system can also compare a first check value for the first data associated with the event and a second check value for the second data associated with the event. Furthermore, the system can re-initiate the event executed by the first software application and the second software application in response to a determination that the first check value does not correspond to the second check value.

20 Claims, 11 Drawing Sheets

(51) Int. Cl.
*G06F 11/14* (2006.01)
*G06F 11/07* (2006.01)
*G06F 11/10* (2006.01)
*G11C 29/00* (2006.01)
*G11C 29/52* (2006.01)

(56) References Cited

U.S. PATENT DOCUMENTS

| | | | | |
|---|---|---|---|---|
| 7,036,059 | B1* | 4/2006 | Carmichael | G06F 11/1004 |
| | | | | 714/725 |
| 7,689,688 | B2* | 3/2010 | Iwamoto | H04L 41/5009 |
| | | | | 709/201 |
| 7,987,385 | B2* | 7/2011 | Pruiett | G06F 11/1641 |
| | | | | 714/10 |
| 9,003,436 | B2* | 4/2015 | Tidwell | H04H 60/64 |
| | | | | 705/14.49 |
| 9,601,217 | B1* | 3/2017 | Karakozova | G11C 29/44 |
| 2002/0152420 | A1 | 10/2002 | Chaudhry et al. | |
| 2008/0244354 | A1 | 10/2008 | Wu et al. | |
| 2010/0010692 | A1* | 1/2010 | Broderick | G05D 1/0077 |
| | | | | 701/3 |
| 2012/0084628 | A1* | 4/2012 | Cox | G06F 11/1048 |
| | | | | 714/763 |
| 2014/0281802 | A1 | 9/2014 | Coe | |

OTHER PUBLICATIONS

Extended European Search Report received for European Patent Application Serial No. 18209841.8 dated Nov. 21, 2019, 12 pages.
Montezanti et al., "A Methodology for Soft Errors Detection and Automatic Recovery", 2017 International Conference on High Performance Computing & Simulation (HPCS), IEEE, Jul. 17, 2017, pp. 134-441.
Oliveira et al., "Applying lockstep in dual-core ARM Cortex-A9 to mitigate radiation-induced soft errors", 2017 IEEE 8TH Latin American Symposium on Circuits & Systems (LASCAS), IEEE, Feb. 20, 2017, 4 pages.
First Office Action received for Canadian Patent Application Serial No. 3,025,781 dated Nov. 19, 2019, 3 pages.
European Communication pursuant to Rule 69 EPC and Invitation pursuant to Rule 70a(1) EPC Report for European Patent Application No. 18209841.8 dated Jan. 8, 2020, 2 pages.

* cited by examiner

MEMORY EVENT MITIGATION IN REDUNDANT SOFTWARE INSTALLATIONS

TECHNICAL FIELD

This disclosure relates generally to memory systems.

BACKGROUND

A single event upset (SEU) can be an unintended change of state in a memory element (e.g., cache memory) of a hardware device. For example, a SEU can be an unintended bit flip in a logic memory element of a hardware device. Generally, a SEU can result from charge in storage elements being unintentionally discharged, for example, as a result of ionizing radiation. A failure event in a memory element of a hardware device can also occur as a result of one or more other vulnerabilities in a hardware device such as, for example, another vulnerability of the memory element, during transmission of data via a data bus of the hardware device, on a processor of the hardware device, etc. As such, it is desirable to detect and/or correct a SEU and/or a failure event with respect to a memory element of a hardware device.

SUMMARY

The following presents a simplified summary of the specification in order to provide a basic understanding of some aspects of the specification. This summary is not an extensive overview of the specification. It is intended to neither identify key or critical elements of the specification, nor delineate any scope of the particular implementations of the specification or any scope of the claims. Its sole purpose is to present some concepts of the specification in a simplified form as a prelude to the more detailed description that is presented later.

According to an embodiment, a system includes an event component, a comparison component and a mitigation component. The event component initiates an event executed by a first software application and a second software application that corresponds to the first software application. The event component also stores first data associated with the first software application in a first data store and stores second data associated with the second software application in a second data store. The comparison component compares a first check value for the first data associated with the event and a second check value for the second data associated with the event. The mitigation component re-initiates the event executed by the first software application and the second software application in response to a determination that the first check value does not correspond to the second check value.

According to an embodiment, a method is provided. The method provides for providing, by a system comprising a processor, event data that initiates execution of an event to a first software application and a second software application that corresponds to the first software application. The method also provides for storing, by the system, first data associated with the first software application in a first data store. Furthermore, the method provides for storing, by the system, second data associated with the second software application in a second data store. The method also provides for comparing, by the system, a first check value for the first data stored in the first data store and a second check value for the second data stored in the second data store. Additionally, the method provides for re-initiating, by the system, the event executed by the first software application and the second software application in response to a determination that the first check value does not correspond to the second check value.

According to an embodiment, a computer readable storage device comprising instructions that, in response to execution, cause a system comprising a processor to perform operations, comprising: providing event data that initiates execution of an event to a first software application associated with first hardware a second software application associated with second hardware, receiving first data generated by the first software application and second data generated by the second software application, comparing a first check value for the first data associated with the event and a second check value for the second data associated with the event, and re-initiating the event executed by the first software application and the second software application in response to a determination that the first check value does not correspond to the second check value.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, implementations, objects and advantages of the present invention will be apparent upon consideration of the following detailed description, taken in conjunction with the accompanying drawings, in which like reference characters refer to like parts throughout, and in which.

DETAILED DESCRIPTION

Figure 1:
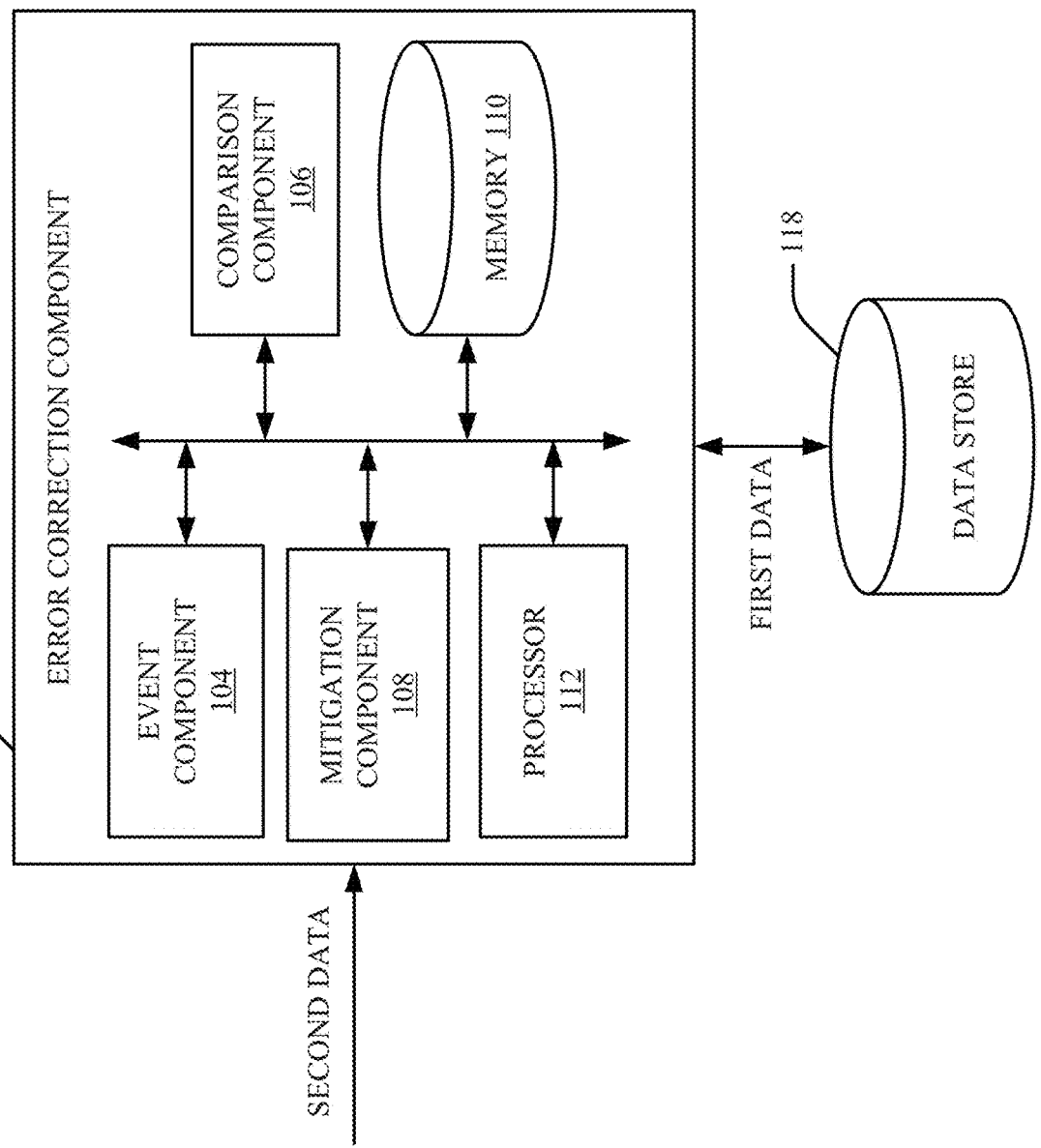
FIG. 1 illustrates a high-level block diagram of an example system that includes an error correction component, in accordance with various aspects and implementations described herein.

Various aspects of this disclosure are now described with reference to the drawings, wherein like reference numerals are used to refer to like elements throughout. In the following description, for purposes of explanation, numerous specific details are set forth in order to provide a thorough understanding of one or more aspects. It should be understood, however, that certain aspects of this disclosure may be practiced without these specific details, or with other methods, components, materials, etc. In other instances, well-known structures and devices are shown in block diagram form to facilitate describing one or more aspects.

Systems and techniques for memory event mitigation in redundant software installations are presented. For example, where there are at least two separate instances of software in memory (e.g., a redundant installation of software in data stores), one or more errors in the memory as a result of a single event upset (SEU) and/or a hardware failure can be detected and/or corrected. In an embodiment, an event management design (e.g., where events drive changes to a given data store and the events are synchronized between redundant installations of software) can be employed to compare data that is expected to be identical. In an aspect, it can be verified that cached data copies on a corresponding installation of software are un-corrupted. Additionally or alternatively, it can be verified that no errors occur during transmission of data or processing of the data associated with a single installation of software or between redundant installations of the software. In response to a determination that an error has occurred occur in a hardware device, corrupted data can be prevented from propagating through the hardware device. Furthermore, a synchronized re-computation on all instances of the installation of software can be requested using corresponding inputs. As such, the error can be corrected in addition to be being identified. For example, a SEU associated with a hardware device can be detected and/or corrected. Performance of a memory device and/or a hardware device (e.g., a processor) can also be improved. For instance, an amount of processing delay by a processor that is employed to mitigate a memory event can be reduced. Moreover, accuracy of data stored in a memory device of a hardware system can also be improved.

Referring initially to FIG. 1, there is illustrated an example system 100 that mitigates a memory event in redundant software installations, according to an aspect of the subject disclosure. The system 100 can be implemented on or in connection with one or more memory devices and/or one or more hardware devices. The system 100 can be employed by various systems, such as, but not limited to aviation systems, industrial systems, manufacturing systems, factory systems, energy management systems, power grid systems, water supply systems, transportation systems, healthcare systems, refinery systems, media systems, research systems, financial systems, data-driven prognostics systems, machine learning systems, neural network systems, network systems, computer network systems, communication systems, router systems, server systems, high availability server systems (e.g., Telecom server systems), Web server systems, file server systems, data server systems, disk array systems, powered insertion board systems, cloud-based systems, and the like. In one example, the system 100 can be associated with a memory system. In another example, the system 100 can be associated with an event management. Moreover, the system 100 and/or the components of the system 100 can be employed to use hardware and/or software to solve problems that are highly technical in nature (e.g., related to memory management, related to memory event management, related to memory event mitigation, etc.), that are not abstract and that cannot be performed as a set of mental acts by a human.

The system 100 can include an error correction component 102. In FIG. 1, the error correction component 102 includes an event component 104, a comparison component 106, and a mitigation component 108. Aspects of the systems, apparatuses or processes explained in this disclosure can constitute machine-executable component(s) embodied within machine(s), e.g., embodied in one or more computer readable mediums (or media) associated with one or more machines. Such component(s), when executed by the one or more machines, e.g., computer(s), computing device(s), virtual machine(s), etc. can cause the machine(s) to perform the operations described. The system 100 (e.g., the error correction component 102) can include memory 110 for storing computer executable components and instructions. The system 100 (e.g., the error correction component 102) can further include a processor 112 to facilitate operation of the instructions (e.g., computer executable components and instructions) by the system 100 (e.g., the error correction component 102). In an embodiment, the error correction component 102 can be communicatively coupled to a software application. In an embodiment, the error correction component 102 can be implemented within the software application. In another embodiment, the error correction component 102 can be communicatively coupled to the software application. The software application can be a redundant software application to facilitate error correction in hardware and/or software. For instance, the software application can be a first software application that is a redundant version of a second software application. In one example, the first software application and the second software application can be two separate instances of the same software (e.g., redundant installations of software) on the two or more hardware.

In an embodiment, the event component 104 can initiate an event executed by the first software application and the second software application. The event executed by the first software application and the second software application can be, for example, an action event that occurs in response to execution of one or more processing threads associated with the first software application and the second software application. In response to the event being executed by the first software application and the second software application, the event component can store first data (e.g., FIRST DATA shown in FIG. 1) associated with the first software application in a first data store 118. The first data can be data generated by the first software application. In an embodiment, the first data store 118 can be a protected data store. Furthermore, in response to the event being executed by the first software application and the second software application, the event component 104 can receive second data (e.g., SECOND DATA shown in FIG. 1) that is generated by the second software application. In an embodiment, the second software application can store the second data in a second data store associated with the second software application. In one example, the first data stores 118 can correspond to a main memory. In an embodiment, the first data can include various data, such as but not limited to, sensor data, process data (e.g., process log data), operational data, monitoring data, maintenance data, parameter data, measurement data, performance data, audio data, image data, video data, industrial data, machine data, asset data, equipment data, device data, meter data, real-time data, historical data and/or other data. The first data can also be encoded data, processed data and/or raw data. Additionally, in an embodiment, the second data can include various data, such as but not limited to, sensor data, process data (e.g., process log data), operational data, monitoring data, maintenance data, parameter data, measurement data, performance data, audio data, image data, video data, industrial data, machine data, asset data, equipment data, device data, meter data, real-time data, historical data and/or other data. The second data can also be encoded data, processed data and/or raw data. In certain embodiments, the event component 104 can synchronize start of event processing on the first software application and the second software application by initiating the event executed by the first software application and the second software application.

The comparison component 106 can compare a first check value for the first data associated with the event and a second check value for the second data associated with the event. For instance, the first check value can be a modified representation of the first data that uniquely represents the first data in a shorter form. In one example, the first check value can be equal to a remainder of a polynomial division of content included in the first data. Similarly, the second check value can be, for example, a modified representation of the second data that uniquely represents the second data in a shorter form. In one example, the second check value can be equal to a remainder of a polynomial division of content included in the second data. In an embodiment, the comparison component 106 can generate the first check value from the first data stored in the first data store 118 using a cyclic redundancy check process that determines the first check value. Additionally, the comparison component 106 can generate the second check value from the second data stored in the second data store using a cyclic redundancy check process that determines the second check value. In an aspect, the comparison component 106 can compare bits values for the first check value and bit values for the second check value. In an embodiment, the comparison component 106 can determine a comparison between the first check value and the second check value based on a distance metric. For example, the comparison component 106 can determine a comparison between the first check value and the second check value based on a Hamming distance. In another example, the comparison component 106 can determine a comparison between the first check value and the second check value based on a Jaccard distance. However, other mechanisms for comparing the first check value and the second check value can be employed. The mitigation component 108 can re-initiate the event executed by the first software application and the second software application in response to a determination that the first check value does not correspond to the second check value. For example, the event can be executed by the first software application and the second software application based on input data that is provided to both the first software application and the second software application. Furthermore, the mitigation component 108 can provide the input data to the first software application and the second software application (e.g., resend the input data to the first software application and the second software application) in response to the determination that the first check value does not correspond to the second check value.

In response to re-initiation of the event by the first software application and the second software application, the event component 104 can store third data associated with the first software application in the first data store. Furthermore, fourth data associated with the second software application can be stored in the second data store. The comparison component 106 can compare a third check value for the third data associated with the re-initiation of the event and a fourth check value for the fourth data associated with the re-initiation of the event. In an embodiment, the mitigation component 108 can maintain the third data in the first data store and/or the fourth data in the second data store in response to a determination that the third check value corresponds to the fourth check value. In another embodiment, the mitigation component 108 can alter a state of two or more hardware associated with the event in response to a determination that the third check value does not correspond to the fourth check value. As such, in certain embodiments, the mitigation component 108 can correct one or more errors associated with two or more hardware associated with the event (e.g., correct a SEU associated with the two or more hardware 114) in response to the determination that the first check value does not correspond to the second check value and/or the determination that the third check value does not correspond to the fourth check value. Furthermore, in another embodiment, the comparison component 106 can compare the first check value and the second check value in response to a determination that the first data value satisfies a defined criterion associated with an amount of time that the first data value is stored in the first data store 118 and/or an amount of time that the second data value is stored in the second data store. For example, in response to a determination that the first data and/or the second data is stored in the first data store 118 and/or the second data store for a certain amount of time (e.g., that the first data and/or the second data are not frequently updated or frequently re-computed), the comparison component 106 can compare the first check value associate with the first data and the second check value associated with the second data.

In an embodiment, the comparison component 106 can compute the first check value associated with the first data and/or the second check value associated with the second data in response to the first data and/or the second data being generated. The comparison component 106 can also store the first data in the first data store 118 and/or can store the second data in the second data store. In certain embodiments, the comparison component 106 can verify that the first data is stored in the first data store 118 and/or that the second data is stored in the second data store (e.g., that the first data and/or the second data are stored in main memory). For example, the comparison component 106 can perform a cache flush operation associated with the first data and/or the second data. The first data and/or the second data can be, for example, stored in temporary memory. For example, in certain embodiments, at least a portion of the memory 110 can be configured as temporary memory to store the first data and/or the second data. Furthermore, the comparison component 106 can read the first data stored in the first data store 118 and/or the second data stored in the second data store. For instance, the comparison component 106 can re-compute the first check value associated with the first data and/or the second check value associated with the second data to, for example, verify that no error is introduced to the first data and the second data while the first data is stored in the first data store 118 and/or the second data is stored in the second data store. The comparison component 106 can also compare the re-computed first check value and/or the re-computed second check value. In response to a determination by the comparison component 106 that the re-computed first check value and the re-computed second check value do not match, the mitigation component 108 can restart a computation associated with the first software application that generated the first data and/or the second software application that generated the second data. In an aspect, the mitigation component 108 can restart a computation associated with the first software application and/or the second software application using the same input data that was previously employed to generate the first data and the second data. In certain embodiments, the comparison component 106 can additionally or alternatively retry a comparison between the re-computed first check value and the re-computed second check value prior to the mitigation component 108 restarting a computation associated with the first software application and/or the second software application.

In another embodiment, the software application and the second software application can exchange and compare check values. As such, one or more errors that occur during transmission of an event, during transmission of data between the first software application and the second software application, during storage of data in the first data store 118 and the second data store, during processing of data by the first software application and the second software application, etc. can be identified. In response to a determination that the check values exchanged between the first software application and the second software application do not match, a computation performed by the first software application and the second software application can be re-executed. In yet another embodiment, in response to a determination that a first check value and a second check value do not match and a certain number of comparison retries has been performed, the mitigation component 108 can alter a mode of hardware associated with the first software application and/or the second hardware application. For example, hardware associated with the first software application and/or the second hardware application can be down-moded to an independent state in response to a determination that a first check value and a second check value do not match and a certain number of comparison retries has been performed. In an aspect, the determination that a first check value and a second check value do not match and a certain number of comparison retries has been performed can indicate that the hardware associated with the first software application and/or the second hardware application is associated with a hardware fault. In yet another embodiment, in response to a determination that a first check value associated with the first software application and a second check value associated with the second software application do not match, an indication that the first check value and the second check value do not match can be provided to one or more other software applications from the two or more software applications.

Accordingly, one or more errors associated with software applications and/or hardware can be detected and/or corrected by employing the error correction component 102. Furthermore, the error correction component 102 be associated with an event management design where events associated with the software applications and/or hardware 114 drive changes to a given data store and the events are synchronized between redundant installations. The error correction component 102 can also verify that cached data copies on the same software installation are un-corrupted and/or that no errors occur during transmission or processing of the data internal to a single software installation or between redundant software installations. Moreover, if one or more errors associated with software applications and/or hardware 114 occur, the error correction component 102 can prevent corrupted data from propagating through software applications and/or the hardware 114 by, for example, initiating a synchronized re-computation on all instances of an event using the exact same inputs for the event.

It is to be appreciated that the error correction component 102 (e.g., the event component 104, the comparison component 106 and/or the mitigation component 108) perform an error correction process and/or an event management process associated with software applications that cannot be performed by a human (e.g., is greater than the capability of a single human mind). For example, an amount of data processed, a speed of processing of data and/or data types processed by the error correction component 102 (e.g., the event component 104, the comparison component 106 and/or the mitigation component 108) over a certain period of time can be greater, faster and different than an amount, speed and data type that can be processed by a single human mind over the same period of time. The error correction component 102 (e.g., the event component 104, the comparison component 106 and/or the mitigation component 108) can also be fully operational towards performing one or more other functions (e.g., fully powered on, fully executed, etc.) while also performing the above-referenced error correction process and/or event management process. Moreover, the error correction component 102 (e.g., the event component 104, the comparison component 106 and/or the mitigation component 108) can include information that is impossible to obtain manually by a user.

Figure 2:
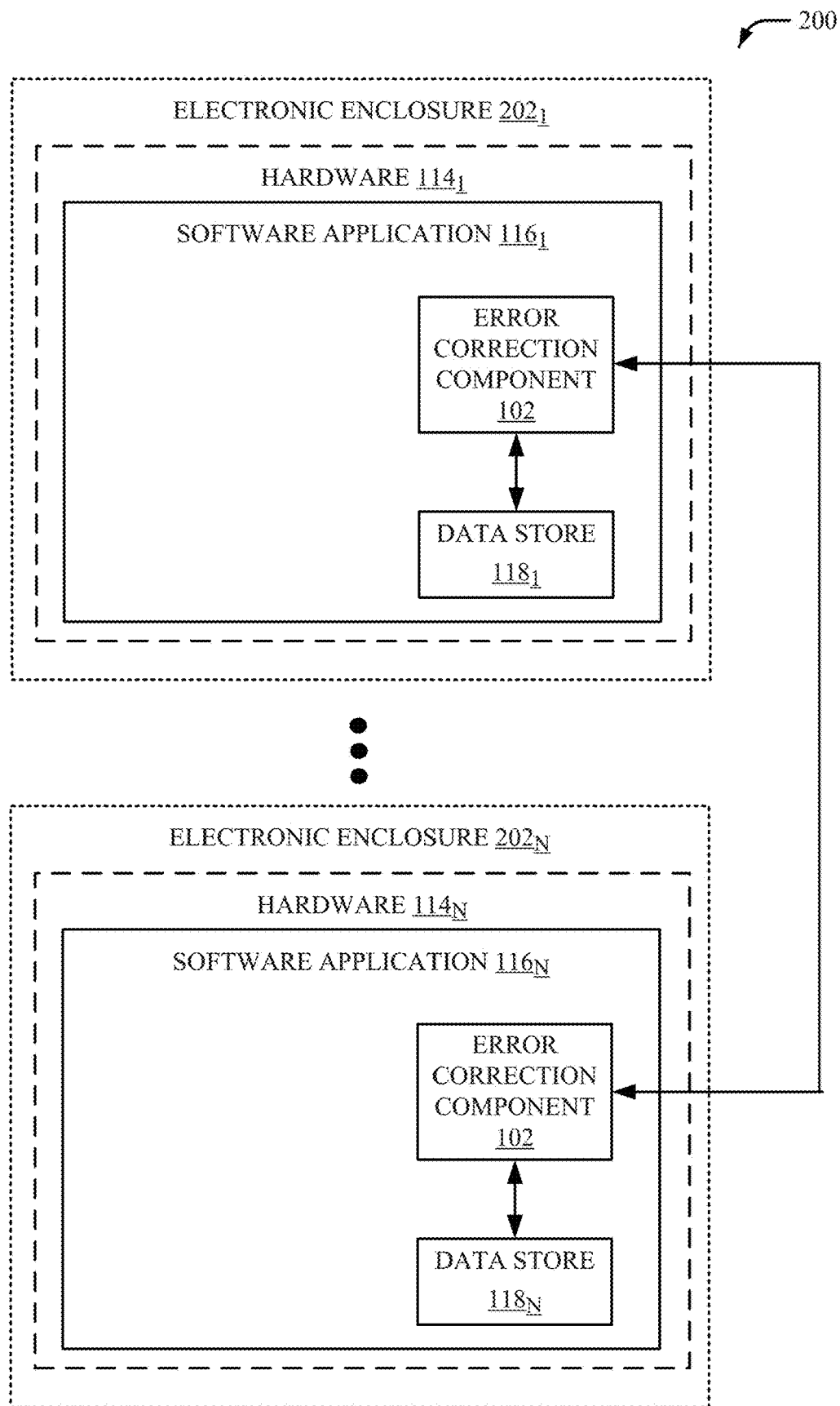
FIG. 2 illustrates a high-level block diagram of another example system that includes an error correction component, in accordance with various aspects and implementations described herein

FIG. 2 illustrates a block diagram of an example, non-limiting system 200 in accordance with one or more embodiments described herein. Repetitive description of like elements employed in other embodiments described herein is omitted for sake of brevity.

The system 200 includes two or more electronic enclosures $202_{1-N}$, where N is an integer greater than or equal to 2. The two or more electronic enclosures $202_{1-N}$ can be associated with two or more hardware $114_{1-N}$ and two or more software applications $116_{1-N}$. Furthermore, each of the two or more electronic enclosures $202_{1-N}$ can include the error correction component 102 and a data store 118. For instance, a first electronic enclosure $202_1$ can include the error correction component 102, a first data store $118_1$, a first hardware $114_1$ and/or a first software application $116_1$. Furthermore, a second electronic enclosure $202_N$ can include the error correction component 102, a second data store $118_N$, a second hardware $114_N$ and/or a second software application $116_N$. The error correction component 102 of the first electronic enclosure $202_1$ can be communicatively coupled to the error correction component 102 of the second electronic enclosure $202_N$. In an embodiment, the error correction component 102 of the first electronic enclosure $202_1$ can be implemented within the first software application $116_1$. In another embodiment, the error correction component 102 of the first electronic enclosure $202_1$ can be communicatively coupled the first software application $116_1$. Similarly, the error correction component 102 of the second electronic enclosure $202_N$ can be implemented within the second software application $116_N$. In another embodiment, the error correction component 102 of the second electronic enclosure $202_N$ can be communicatively coupled the second software application $116_N$. The two or more electronic enclosures $202_{1-N}$ can be electronic enclosures associated with an aviation system, an industrial system, a manufacturing system, a factory system, an energy management system, a power grid system, a water supply system, a transportation system, a healthcare system, a refinery system, a media system, a research system, a financial system, a data-driven prognostics system, a machine learning system, a neural network system, a network system, a computer network system, a communication system, a router system, a server system, a high availability server system (e.g., a Telecom server system), a Web server system, a file server system, a data server system, a disk array system, a powered insertion board system, a cloud-based system, or another type of system. For instance, in a non-limiting example, the two or more electronic enclosures $202_{1-N}$ can be located on an aviation system (e.g., an airplane, etc.) to facilitate one or more processes and/or processing threads for the aviation system. In an aspect, the two or more electronic enclosures $202_{1-N}$ can be physical boxes that encase corresponding hardware $114_{1-N}$ and corresponding software applications $116_{1-N}$.

In an embodiment, the two or more software applications $116_{1-N}$ can be redundant software applications. For example, the first software application $116_1$ can be a copy of the second software application $116_N$. As such, the first software application $116_1$ and the second software application $116_N$ can be two separate instances of the same software (e.g., redundant installations of software) on the two or more hardware $114_{1-N}$. In an embodiment, the event component 104 of the error correction component 102 included in the first electronic enclosure $202_1$ can initiate an event executed by the first software application $116_1$ and the second software application $116_N$ that corresponds to the first software application $116_1$. In response to the event being executed by the first software application $116_1$ and the second software application $116_N$, the event component 104 of the error correction component 102 included in the first electronic enclosure $202_1$ can store the first data associated with the first software application $116_1$ in the first data store $118_1$. Furthermore, in response to the event being executed by the first software application $116_1$ and the second software application $116_N$, the event component 104 of the error correction component 102 included in the second electronic enclosure $202_N$ can store the second data associated with the second software application $116_N$ in the second data store $118_N$. In one example, the two or more data stores $118_{1-N}$ can correspond to a main memory. In certain embodiments, the event component 104 of the error correction component 102 included in the first electronic enclosure $202_1$ can synchronize start of event processing on the first software application $116_1$ and the second software application $116_N$ by initiating the event executed by the first software application $116_1$ and the second software application $116_N$.

In another embodiment, the comparison component 106 of the error correction component 102 included in the first electronic enclosure $202_1$ can compare a first check value for the first data associated with the event and a second check value for the second data associated with the event. For instance, the first check value can be a modified representation of the first data that uniquely represents the first data in a shorter form. In one example, the first check value can be equal to a remainder of a polynomial division of content included in the first data. Similarly, the second check value can be, for example, a modified representation of the second data that uniquely represents the second data in a shorter form. In one example, the second check value can be equal to a remainder of a polynomial division of content included in the second data. In an embodiment, the comparison component 106 of the error correction component 102 included in the first electronic enclosure $202_1$ can generate the first check value from the first data stored in the first data store $118_1$ using a cyclic redundancy check process that determines the first check value. Additionally, the comparison component 106 of the error correction component 102 included in the second electronic enclosure $202_N$ can generate the second check value from the second data stored in the second data store $118_N$ using a cyclic redundancy check process that determines the second check value. In an aspect, the comparison component 106 of the error correction component 102 included in the first electronic enclosure $202_1$ can compare bits values for the first check value and bit values for the second check value. In an embodiment, the comparison component 106 of the error correction component 102 included in the first electronic enclosure $202_1$ can determine a comparison between the first check value and the second check value based on a distance metric. For example, the comparison component 106 of the error correction component 102 included in the first electronic enclosure $202_1$ can determine a comparison between the first check value and the second check value based on a Hamming distance. In another example, the comparison component 106 of the error correction component 102 included in the first electronic enclosure $202_1$ can determine a comparison between the first check value and the second check value based on a Jaccard distance. However, other mechanisms for comparing the first check value and the second check value can be employed. The mitigation component 108 of the error correction component 102 included in the first electronic enclosure $202_1$ can re-initiate the event executed by the first software application $116_1$ and the second software application $116_N$ in response to a determination that the first check value does not correspond to the second check value. For example, the event can be executed by the first software application $116_1$ and the second software application $116_N$ based on input data that is provided to both the first software application $116_1$ and the second software application $116_N$. Furthermore, the mitigation component 108 of the error correction component 102 included in the first electronic enclosure $202_1$ can provide the input data to the first software application $116_1$ and the second software application $116_N$ (e.g., resend the input data to the first software application $116_1$ and the second software application $116_N$) in response to the determination that the first check value does not correspond to the second check value.

In response to re-initiation of the event by the first software application $116_1$ and the second software application $116_N$, the event component 104 of the error correction component 102 included in the first electronic enclosure $202_1$ can store the third data associated with the first software application $116_1$ in the first data store $118_1$. Furthermore, in response to re-initiation of the event by the first software application $116_1$ and the second software application $116_N$, the event component 104 of the error correction component 102 included in the second electronic enclosure $202_N$ can store the fourth data associated with the second software application $116_N$ in the second data store $118_N$. The comparison component 106 of the error correction component 102 included in the first electronic enclosure $202_1$ can compare a third check value for the third data associated with the re-initiation of the event and a fourth check value for the fourth data associated with the re-initiation of the event. In an embodiment, the mitigation component 108 of the error correction component 102 included in the first electronic enclosure 202$_k$ can maintain the third data in the first data store 118$_1$ in response to a determination that the third check value corresponds to the fourth check value. Furthermore, the mitigation component 108 of the error correction component 102 included in the second electronic enclosure 202$_N$ can maintain the fourth data in the second data store 118$_N$ in response to a determination that the third check value corresponds to the fourth check value. In another embodiment, the mitigation component 108 of the error correction component 102 included in the first electronic enclosure 202$_1$ can alter a state of the two or more hardware 114$_{1-N}$ associated with the event in response to a determination that the third check value does not correspond to the fourth check value. As such, in certain embodiments, the mitigation component 108 of the error correction component 102 included in the first electronic enclosure 202$_1$ can correct one or more errors associated with the two or more hardware 114$_{1-N}$ (e.g., correct a SEU associated with the two or more hardware 114$_{1-N}$) in response to the determination that the first check value does not correspond to the second check value and/or the determination that the third check value does not correspond to the fourth check value. Furthermore, in another embodiment, the comparison component 106 of the error correction component 102 included in the first electronic enclosure 202$_1$ can compare the first check value and the second check value in response to a determination that the first data value satisfies a defined criterion associated with an amount of time that the first data value is stored in the first data store 118$_1$ and/or an amount of time that the second data value is stored in the second data store 118$_N$. For example, in response to a determination that the first data and/or the second data is stored in the first data store 118$_1$ and/or the second data store 118$_N$ for a certain amount of time (e.g., that the first data and/or the second data are not frequently updated or frequently re-computed), the comparison component 106 can compare the first check value associate with the first data and the second check value associated with the second data.

In an embodiment, the comparison component 106 of the error correction component 102 included in the first electronic enclosure 202$_1$ can compute the first check value associated with the first data and/or the comparison component 106 of the error correction component 102 included in the second electronic enclosure 202$_N$ can compute the second check value associated with the second data in response to the first data and the second data being generated. The comparison component 106 of the error correction component 102 included in the first electronic enclosure 202$_1$ can also store the first data in the first data store 118$_1$ and/or the comparison component 106 of the error correction component 102 included in the second electronic enclosure 202$_N$ can store the second data in the second data store 118$_N$. In certain embodiments, the comparison component 106 of the error correction component 102 included in the first electronic enclosure 202$_1$ can verify that the first data is stored in the first data store 118$_1$ and/or that the second data is stored in the second data store 118$_N$ (e.g., that the first data and the second data are stored in main memory). For example, the comparison component 106 of the error correction component 102 included in the first electronic enclosure 202$_1$ can perform a cache flush operation associated with the first data and/or the second data. Furthermore, the comparison component 106 of the error correction component 102 included in the first electronic enclosure 202$_1$ can read the first data stored in the first data store 118$_1$ and/or the second data stored in the second data store 118$_N$. For instance, the comparison component 106 of the error correction component 102 included in the first electronic enclosure 202$_1$ can re-compute the first check value associated with the first data and/or the second check value associated with the second data to, for example, verify that no error is introduced to the first data and the second data while the first data is stored in the first data store 118$_1$ and the second data is stored in the second data store 118$_N$. The comparison component 106 of the error correction component 102 included in the first electronic enclosure 202$_1$ can also compare the re-computed first check value and the re-computed second check value. In response to a determination by the comparison component 106 of the error correction component 102 included in the first electronic enclosure 202$_1$ that the re-computed first check value and the re-computed second check value do not match, the mitigation component 108 of the error correction component 102 included in the first electronic enclosure 202$_1$ can restart a computation associated with the first software application 116$_1$ that generated the first data and the second software application 116$_N$ that generated the second data. In an aspect, the mitigation component 108 of the error correction component 102 included in the first electronic enclosure 202$_1$ can restart a computation associated with the first software application 116$_1$ and/or the second software application 116$_N$ using the same input data that was previously employed to generate the first data and the second data. In certain embodiments, the comparison component 106 of the error correction component 102 included in the first electronic enclosure 202$_1$ can additionally or alternatively retry a comparison between the re-computed first check value and the re-computed second check value prior to the mitigation component 108 of the error correction component 102 included in the first electronic enclosure 202$_1$ restarting a computation associated with the first software application 116$_1$ and the second software application 116$_N$.

In another embodiment, the first software application 116$_1$ and the second software application 116$_N$ can exchange and compare check values. As such, one or more errors that occur during transmission of an event, during transmission of data between the first software application 116$_1$ and the second software application 116$_N$, during storage of data in the first data store 118$_1$ and the second data store 118$_N$, during processing of data by the first software application 116$_1$ and the second software application 116$_N$, etc. can be identified. In response to a determination that the check values exchanged between the first software application 116$_1$ and the second software application 116$_N$ do not match, a computation performed by the first software application 116$_1$ and the second software application 116$_N$ can be re-executed. In yet another embodiment, in response to a determination that a first check value and a second check value do not match and a certain number of comparison retries has been performed, the mitigation component 108 of the error correction component 102 included in the first electronic enclosure 202$_1$ can alter a mode of the first hardware 114$_1$ and/or the second hardware 114$_N$. For example, the first hardware 114$_1$ and/or the second hardware 114$_N$ can be down-moded to an independent state in response to a determination that a first check value and a second check value do not match and a certain number of comparison retries has been performed. In an aspect, the determination that a first check value and a second check value do not match and a certain number of comparison retries has been performed can indicate that the first hardware $114_1$ and/or the second hardware $114_N$ is associated with a hardware fault. In yet another embodiment, in response to a determination that a first check value associated with the first software application $116_1$ and a second check value associated with the second software application $116_N$ do not match, an indication that the first check value and the second check value do not match can be provided to one or more other software applications from the two or more software applications $116_{1-N}$.

Accordingly, one or more errors associated with the two or more software applications $116_{1-N}$ and/or the two or more hardware $114_{1-N}$ can be detected and/or corrected by employing the error correction component 102. Furthermore, the error correction component 102 be associated with an event management design where events associated with the two or more software applications $116_{1-N}$ and/or the two or more hardware $114_{1-N}$ drive changes to a given data store and the events are synchronized between redundant installations. The error correction component 102 can also verify that cached data copies on the same software installation are un-corrupted and/or that no errors occur during transmission or processing of the data internal to a single software installation or between redundant software installations. Moreover, if one or more errors associated with the two or more software applications $116_{1-N}$ and/or the two or more hardware $114_{1-N}$ occur, the error correction component 102 can prevent corrupted data from propagating through the two or more software applications $116_{1-N}$ and/or the two or more hardware $114_{1-N}$ by, for example, initiating a synchronized re-computation on all instances of an event using the exact same inputs for the event.

Figure 3:
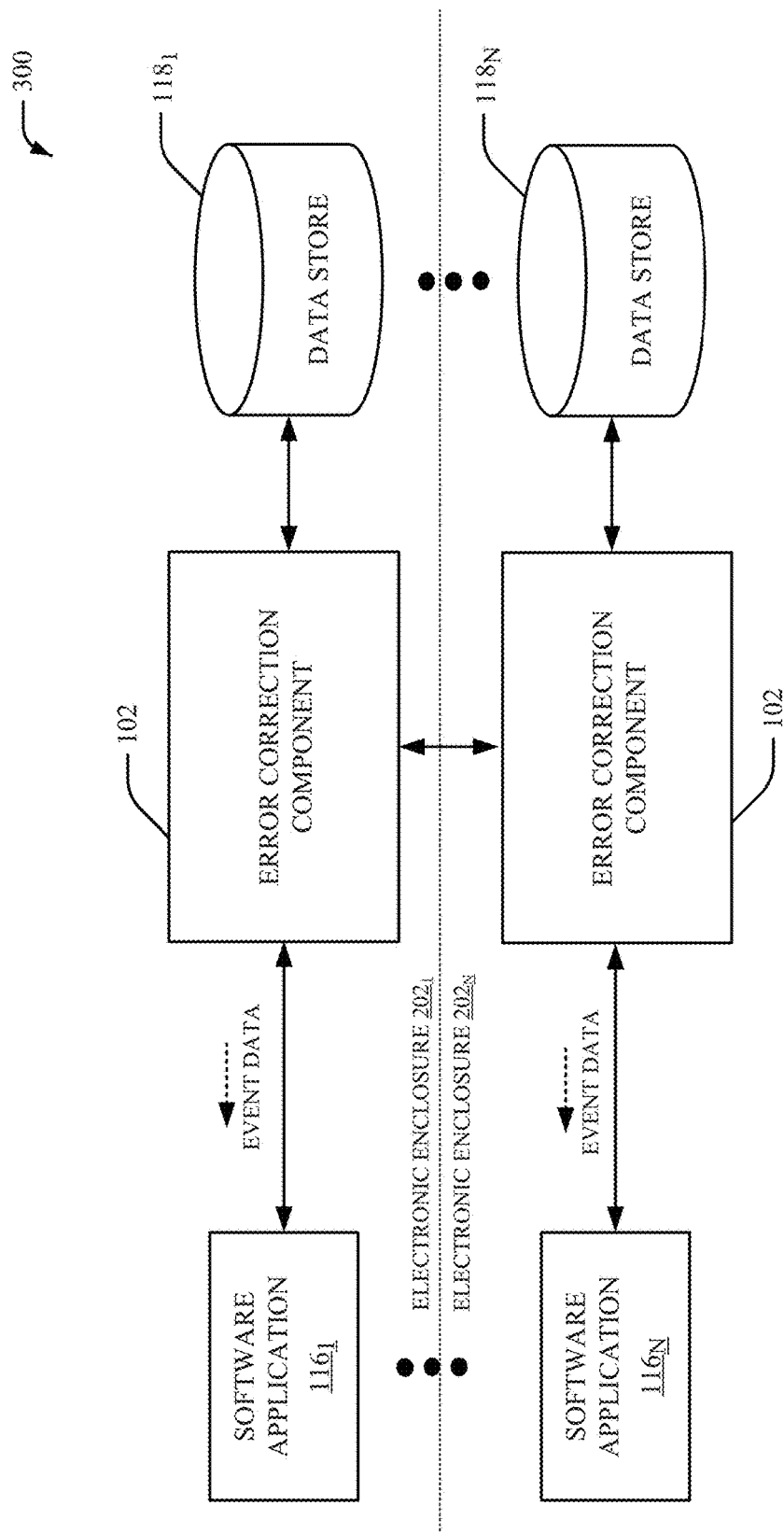
FIG. 3 illustrates an example system to facilitate mitigation of a memory event in redundant software installations, in accordance with various aspects and implementations described herein.

FIG. 3 illustrates a block diagram of an example, non-limiting system 300 in accordance with one or more embodiments described herein. Repetitive description of like elements employed in other embodiments described herein is omitted for sake of brevity.

The system 300 includes the error correction component 102 included in the first electronic enclosure $202_1$ and the error correction component 102 included in the second electronic enclosure $202_N$. In an embodiment, the error correction component 102 and/or the first data store $118_1$ included in the first electronic enclosure $202_1$ can be communicatively coupled to and/or included in the first software application $116_1$. Furthermore, in an embodiment, the error correction component 102 and/or the second data store $118_N$ included in the second electronic enclosure $202_N$ can be communicatively coupled to and/or included in the second software application $116_N$. Additionally, in an embodiment, the error correction component 102 included in the first electronic enclosure $202_1$ can be communicatively coupled to the first data stores $118_1$ and the error correction component 102 included in the second electronic enclosure $202_N$ can be communicatively coupled to the second data stores $118_N$. As shown in FIG. 3, the event component 104 of the error correction component 102 included in the first electronic enclosure $202_1$ and/or the event component 104 of the error correction component 102 included in the second electronic enclosure $202_N$ can initiate an event that is executed by the first software application $116_1$ and the second software application $116_N$ by generating event data (e.g., EVENT DATA shown in FIG. 3). The event data can be provided to both the first software application $116_1$ and the second software application $116_N$. For example, the event data can be provided in parallel (e.g., approximately in parallel) to both the first software application $116_1$ and the second software application $116_N$. The event data can initiate the event that is executed by the first software application $116_1$ and the second software application $116_N$. In one example, the event can be a computational process performed by the first software application $116_1$ and the second software application $116_N$. In another example, the event can be a set of processing threads executed by the first software application $116_1$ and the second software application $116_N$.

Figure 4:
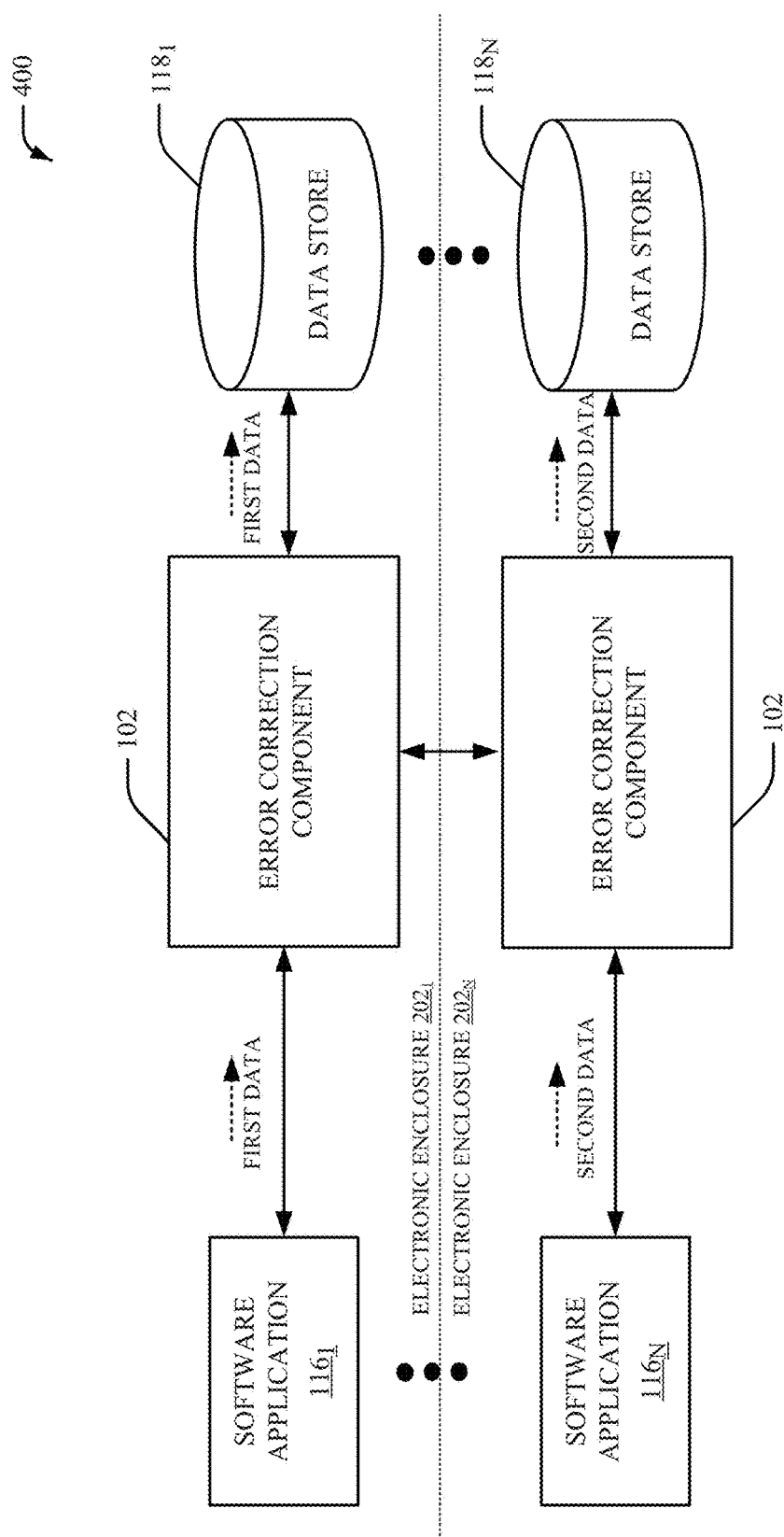
FIG. 4 illustrates another example system to facilitate mitigation of a memory event in redundant software installations, in accordance with various aspects and implementations described herein.

FIG. 4 illustrates a block diagram of an example, non-limiting system 400 in accordance with one or more embodiments described herein. Repetitive description of like elements employed in other embodiments described herein is omitted for sake of brevity. The system 400 can further illustrate an embodiment shown in FIG. 3.

The system 400 includes the error correction component 102 included in the first electronic enclosure $202_1$ and the error correction component 102 included in the second electronic enclosure $202_N$. In an embodiment, the error correction component 102 and/or the first data store $118_1$ included in the first electronic enclosure $202_1$ can be communicatively coupled to and/or included in the first software application $116_1$. Furthermore, in an embodiment, the error correction component 102 and/or the second data store $118_N$ included in the second electronic enclosure $202_N$ can be communicatively coupled to and/or included in the second software application $116_N$. Additionally, in an embodiment, the error correction component 102 included in the first electronic enclosure $202_1$ can be communicatively coupled to the first data stores $118_1$ and the error correction component 102 included in the second electronic enclosure $202_N$ can be communicatively coupled to the second data stores $118_N$. As shown in FIG. 4, the first software application $116_1$ can generate the first data (e.g., FIRST DATA shown in FIG. 4) in response to the event data. Furthermore, the second software application $116_N$ can generate the second data (e.g., SECOND DATA shown in FIG. 4) in response to the event data. In an aspect, the first data associated with the first software application $116_1$ can be stored in the first data store $118_1$ and the second data associated with the second software application $116_N$ can be stored in the second data store $118_N$. In embodiment, the comparison component 106 of the error correction component 102 included in the first electronic enclosure $202_1$ can compare a first check value for the first data stored in the first data store $118_1$ and a second check value for the second data stored in the second data store $118_N$. The first check value can be, for example, a shortened representation of the first data. For example, the first check value can be equal to a remainder of a polynomial division of content included in the first data. Similarly, the second check value can be, for example, a shortened representation of the second data. For example, the second check value can be equal to a remainder of a polynomial division of content included in the second data. In an embodiment, the first data can include various data, such as but not limited to, sensor data, process data (e.g., process log data), operational data, monitoring data, maintenance data, parameter data, measurement data, performance data, audio data, image data, video data, industrial data, machine data, asset data, equipment data, device data, meter data, real-time data, historical data and/or other data. The first data can also be encoded data, processed data and/or raw data. Additionally, in an embodiment, the second data can include various data, such as but not limited to, sensor data, process data (e.g., process log data), operational data, monitoring data, maintenance data, parameter data, measurement data, performance data, audio data, image data, video data, industrial data, machine data, asset data, equipment data, device data, meter data, real-time data, historical data and/or other data. The second data can also be encoded data, processed data and/or raw data.

Figure 5:
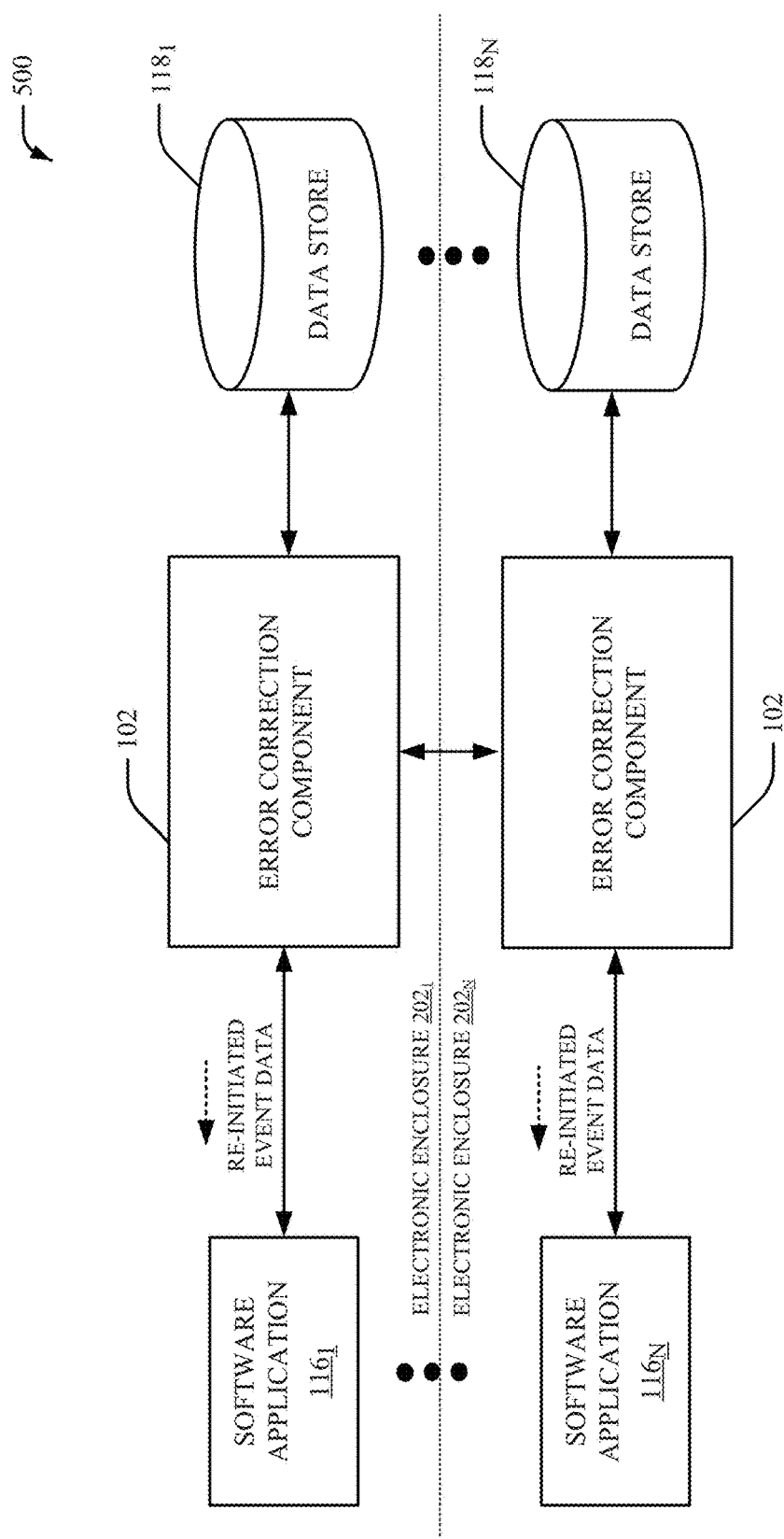
FIG. 5 illustrates yet another example system to facilitate mitigation of a memory event in redundant software installations, in accordance with various aspects and implementations described herein.

FIG. 5 illustrates a block diagram of an example, non-limiting system 500 in accordance with one or more embodiments described herein. Repetitive description of like elements employed in other embodiments described herein is omitted for sake of brevity. The system 500 can further illustrate embodiment(s) shown in FIGS. 3 and 4.

The system 500 includes the error correction component 102 included in the first electronic enclosure $202_1$ and the error correction component 102 included in the second electronic enclosure $202_N$. In an embodiment, the error correction component 102 and/or the first data store $118_1$ included in the first electronic enclosure $202_1$ can be communicatively coupled to and/or included in the first software application $116_1$. Furthermore, in an embodiment, the error correction component 102 and/or the second data store $118_N$ included in the second electronic enclosure $202_N$ can be communicatively coupled to and/or included in the second software application $116_N$. Additionally, in an embodiment, the error correction component 102 included in the first electronic enclosure $202_1$ can be communicatively coupled to the first data stores $118_1$ and the error correction component 102 included in the second electronic enclosure $202_N$ can be communicatively coupled to the second data stores $118_N$. As shown in FIG. 5, in certain embodiments, re-initiated event data (e.g., RE-INITIATED EVENT DATA shown in FIG. 5) can be provided to both the first software application $116_1$ and the second software application $116_N$. For instance, the mitigation component 108 of the error correction component 102 included in the first electronic enclosure $202_1$ and/or the mitigation component 108 of the error correction component 102 included in the second electronic enclosure $202_N$ can re-initiate the event (e.g., the event data) executed by the first software application $116_1$ and the second software application $116_N$ in response to a determination (e.g., by the comparison component 106) that the first check value for the first data stored in the first data store $118_1$ does not correspond to the second check value for the second data stored in the second data store $118_N$. The mitigation component 108 of the error correction component 102 included in the first electronic enclosure $202_1$ and/or the mitigation component 108 of the error correction component 102 included in the second electronic enclosure $202_N$ can re-initiate the event (e.g., the event data) executed by the first software application $116_1$ and the second software application $116_N$ by, for example, generating the re-initiated event data. In an aspect, the re-initiated event data can be provided in parallel (e.g., approximately in parallel) to both the first software application $116_1$ and the second software application $116_N$. The re-initiated event data can re-initiate the event that is executed by the first software application $116_1$ and the second software application $116_N$. In one example, the re-initiated event can be a computational process performed by the first software application $116_1$ and the second software application $116_N$. In another example, the re-initiated event can be a set of processing threads executed by the first software application $116_1$ and the second software application $116_N$. In another aspect, the re-initiated event data can include input data for the first software application $116_1$ and the second software application $116_N$ that corresponds to input data included in the event data.

Figure 6:
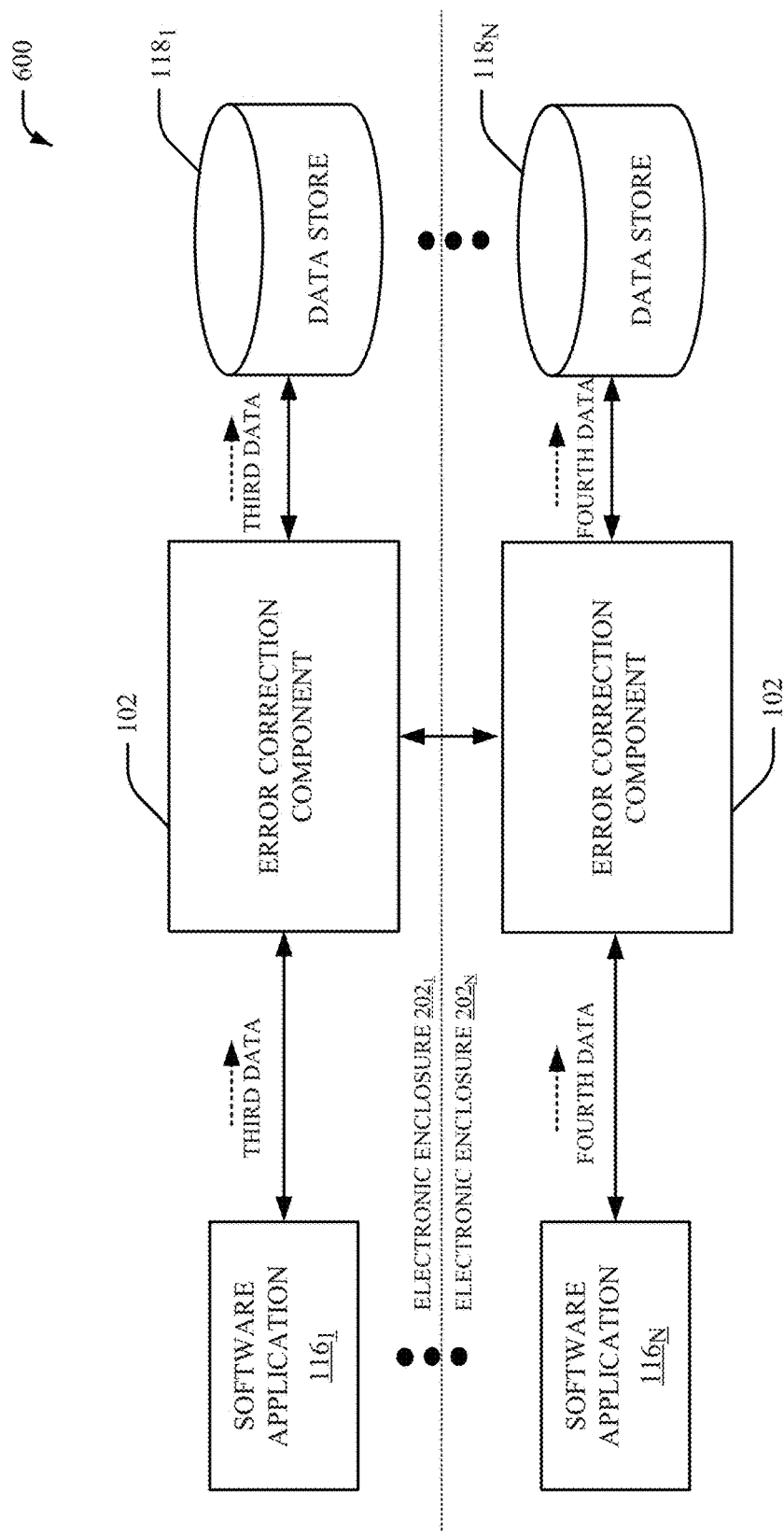
FIG. 6 illustrates yet another example system to facilitate mitigation of a memory event in redundant software installations, in accordance with various aspects and implementations described herein.

FIG. 6 illustrates a block diagram of an example, non-limiting system 600 in accordance with one or more embodiments described herein. Repetitive description of like elements employed in other embodiments described herein is omitted for sake of brevity. The system 600 can further illustrate embodiment(s) shown in FIGS. 3-5.

The system 600 includes the error correction component 102 included in the first electronic enclosure $202_1$ and the error correction component 102 included in the second electronic enclosure $202_N$. In an embodiment, the error correction component 102 and/or the first data store $118_1$ included in the first electronic enclosure $202_1$ can be communicatively coupled to and/or included in the first software application $116_1$. Furthermore, in an embodiment, the error correction component 102 and/or the second data store $118_N$ included in the second electronic enclosure $202_N$ can be communicatively coupled to and/or included in the second software application $116_N$. Additionally, in an embodiment, the error correction component 102 included in the first electronic enclosure $202_1$ can be communicatively coupled to the first data stores $118_1$ and the error correction component 102 included in the second electronic enclosure $202_N$ can be communicatively coupled to the second data stores $118_N$. As shown in FIG. 6, the first software application $116_1$ can generate third data (e.g., THIRD DATA shown in FIG. 6) in response to the re-initiated event data. Furthermore, the second software application $116_N$ can generate fourth data (e.g., FOURTH DATA shown in FIG. 6) in response to the re-initiated event data. In an aspect, the third data associated with the first software application $116_1$ can be stored in the first data store $118_1$ and the fourth data associated with the second software application $116_N$ can be stored in the second data store $118_N$. In embodiment, the comparison component 106 of the error correction component 102 included in the first electronic enclosure $202_1$ can compare a third check value for the third data stored in the first data store $118_1$ and a fourth check value for the fourth data stored in the second data store $118_N$. The third check value can be, for example, a shortened representation of the third data. For example, the third check value can be equal to a remainder of a polynomial division of content included in the third data. Similarly, the fourth check value can be, for example, a shortened representation of the fourth data. For example, the fourth check value can be equal to a remainder of a polynomial division of content included in the fourth data. In an embodiment, the mitigation component 108 of the error correction component 102 included in the first electronic enclosure $202_1$ can maintain the third data in the first data store $118_1$ and/or the mitigation component 108 of the error correction component 102 included in the second electronic enclosure $202_N$ can maintain the fourth data in the second data store $118_N$ in response to a determination that the third check value corresponds to the fourth check value. In another embodiment, the mitigation component 108 of the error correction component 102 included in the first electronic enclosure $202_1$ can alter a state of the first hardware $114_1$ and/or the second hardware $114_N$ in response to a determination that the third check value does not correspond to the fourth check value. In an embodiment, the third data can include various data, such as but not limited to, sensor data, process data (e.g., process log data), operational data, monitoring data, maintenance data, parameter data, measurement data, performance data, audio data, image data, video data, industrial data, machine data, asset data, equipment data, device data, meter data, real-time data, historical data and/or other data. The third data can also be encoded data, processed data and/or raw data. Additionally, in an embodiment, the fourth data can include various data, such as but not limited to, sensor data, process data (e.g., process log data), operational data, monitoring data, maintenance data, parameter data, measurement data, performance data, audio data, image data, video data, industrial data, machine data, asset data, equipment data, device data, meter data, real-time data, historical data and/or other data. The fourth data can also be encoded data, processed data and/or raw data.

Figure 7:
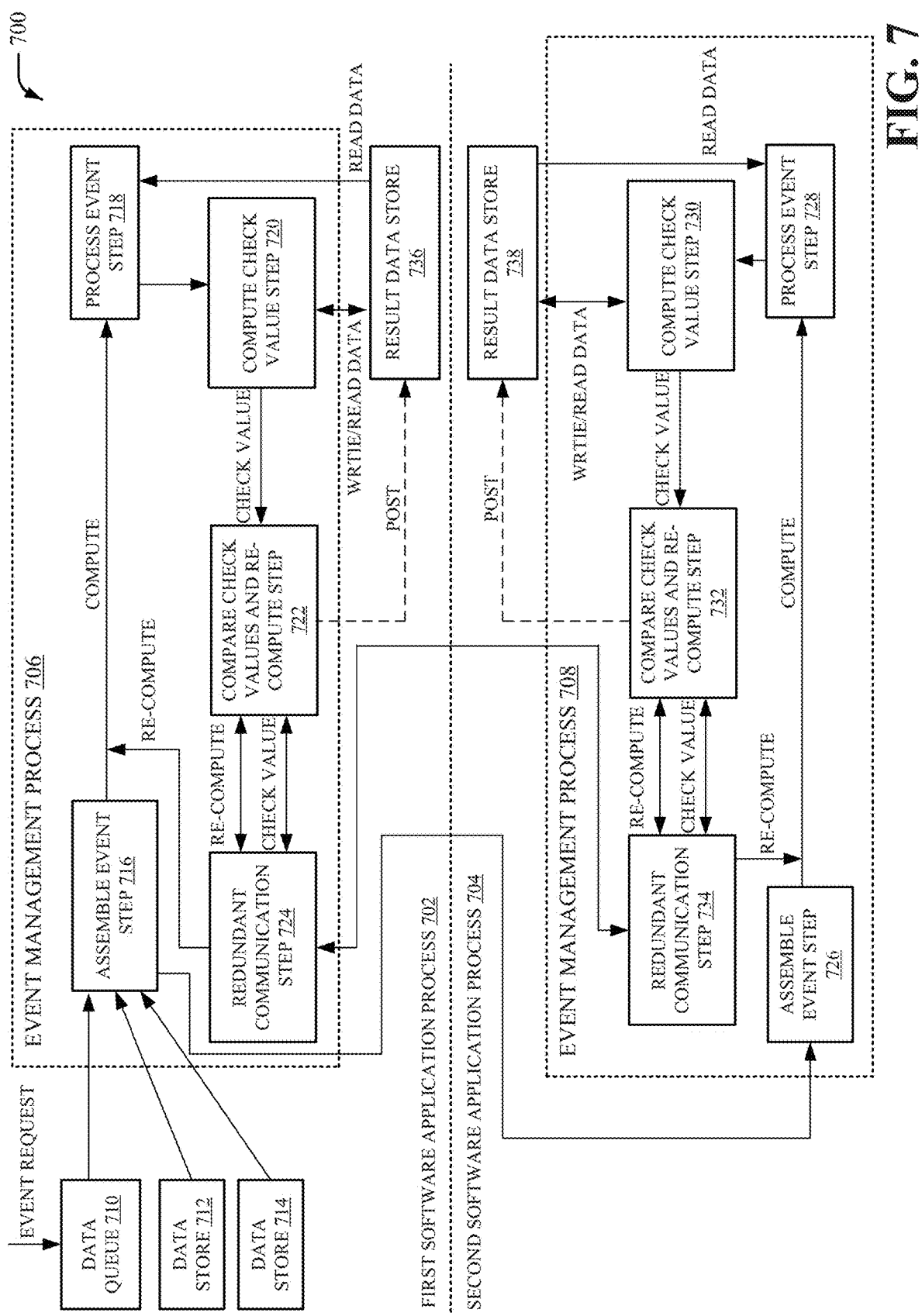
FIG. 7 illustrates an example system to facilitate event management data flow to mitigate a memory event in redundant software installations, in accordance with various aspects and implementations described herein.

FIG. 7 illustrates a block diagram of an example, non-limiting system 700 in accordance with one or more embodiments described herein. Repetitive description of like elements employed in other embodiments described herein is omitted for sake of brevity.

The system includes a first software application process 702 and a second software application process 704. For example, the first software application process 702 can be a process performed by the error correction component 102 with respect to the first software application $116_1$. Furthermore, the second software application process 704 can be a process performed by the error correction component 102 with respect to the second software application $116_N$. The first software application process 702 can include an event management process 706 and the second software application process 704 can include an event management process 708. With the first software application process 702, an event request can be received by a data queue 710. The event request can initiate the event management process 706. For instance, data from a data store 712 and data from a data store 714 can be processed by the event management process 706. In an embodiment, the data from the data store 712 can be, for example, data associated with a first software application (e.g., first software application $116_1$). Furthermore, in an embodiment, the data from the data store 714 can be, for example, data associated with a second software application (e.g., second software application $116_N$). An assemble event step 716 of the event management process 706 can assemble an event for execution by a first software application (e.g., first software application $116_1$). For instance, the event management process 706 can compute an event in response to the assemble event step 716. A process event step 718 of the event management process 706 can process the event assembled by the assemble event step 716. A compute check value compare step 720 can compute a check value for data generated by the process event step 718.

At a compare check values and re-compute step 722, the check value generated by the compute check value step 720 can be compared to a check value generated by the second software application process 704. For instance, the event request can also initiate an event management process 708 of the second software application process 704 in parallel to the event management process 706. In an aspect, data from the data store 712 and data from the data store 714 can also be processed by the event management process 708. An assemble event step 726 of the event management process 708 can assemble an event for execution by a second software application (e.g., second software application $116_N$). For instance, the event management process 708 can compute an event in response to the assemble event step 726. A process event step 728 of the event management process 708 can process the event assembled by the assemble event step 726. A compute check value compare step 730 can compute a check value for data generated by the process event step 728. The check value for data generated by the process event step 728 can be compared to the check value for data generated by the process event step 718. In an embodiment, the compare check values and re-compute step 722 of the event management process 706 and/or a compare check values and re-compute step 732 of the event management process 708 can compare check values generated by the event management process 706 and the event management process 708. In certain embodiments, a redundant communication step 724 of the event management process 706 and/or a redundant communication step 734 of the event management process 708 can be employed to facilitate communication between the first software application process 702 and the second software application process 704. In certain embodiments, result data associated with the event management process 706 (e.g., result data generated by the compare check values and re-compute step 722) can be stored in a result data store 736. Additionally or alternatively, result data associated with the event management process 708 (e.g., result data generated by the compare check values and re-compute step 732) can be stored in a result data store 738.

The aforementioned systems and/or devices have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 8:
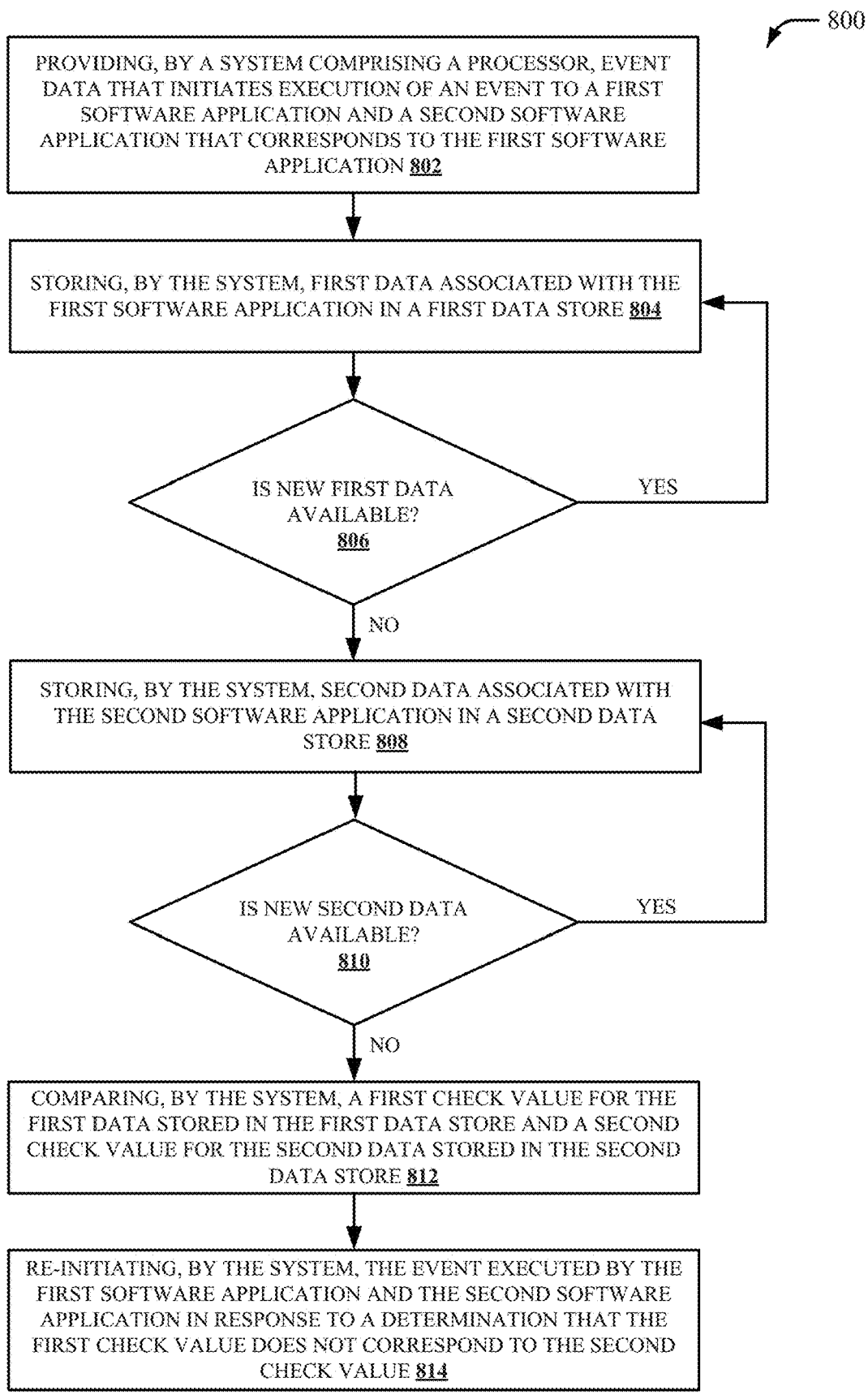
FIG. 8 depicts a flow diagram of an example method for mitigating memory events in redundant software installations, in accordance with various aspects and implementations described herein.
Figure 9:
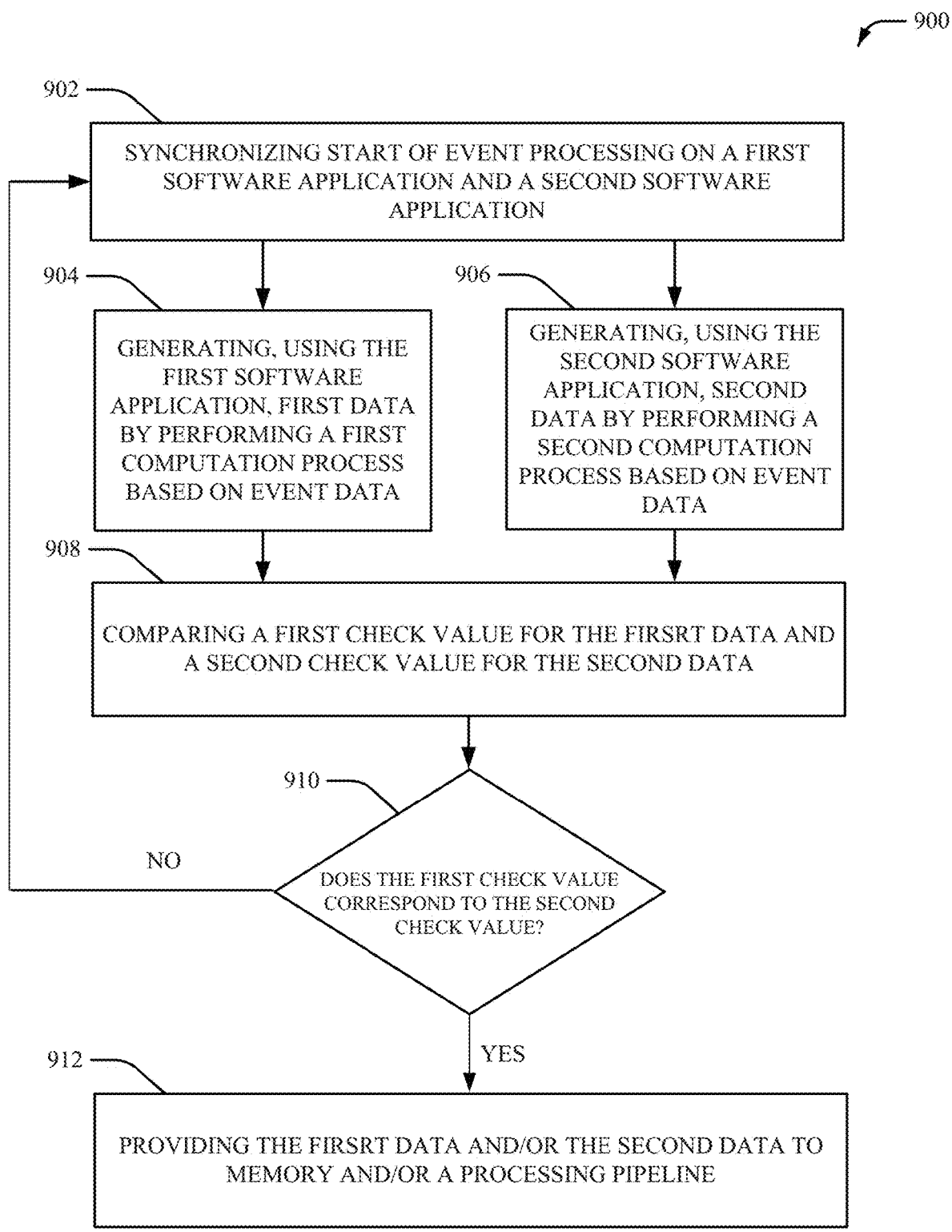
FIG. 9 depicts a flow diagram of another example method for mitigating memory events in redundant software installations, in accordance with various aspects and implementations described herein.

FIGS. 8-9 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device or storage media.

Referring to FIG. 8, there illustrated is a methodology 800 for mitigating memory events in redundant software installations, according to an aspect of the subject innovation. As an example, the methodology 800 can be utilized in various applications, such as, but not limited to, aviation systems, industrial systems, manufacturing systems, factory systems, energy management systems, power grid systems, water supply systems, transportation systems, healthcare systems, refinery systems, media systems, research systems, financial systems, data-driven prognostics systems, machine learning systems, neural network systems, network systems, computer network systems, communication systems, router systems, server systems, high availability server systems (e.g., Telecom server systems), Web server systems, file server systems, data server systems, disk array systems, powered insertion board systems, cloud-based systems, etc. At 802, event data that initiates execution of an event to a first software application and a second software application is provided by a system comprising a processor (e.g., by event component 104). The second software application corresponds to the first software application. In an embodiment, the first software application can be implemented on first hardware (e.g., a first processor, a first electronic enclosure that includes a processor, etc.) and the second software application can be implemented on second hardware (e.g., a second processor, a first electronic enclosure that includes a processor, etc.).

At 804, first data associated with the first software application is stored, by the system (e.g., by event component 104) in a first data store. For example, first data that is generated by the first software application in response to receiving the event data can be stored in a first data store.

At 806, it is determined whether new first data is available. If yes, methodology 800 returns to 804. If no, methodology 800 proceeds to 808.

At 808, second data associated with the second software application is stored, by the system (e.g., by event component 104) in a second data store. For example, second data that is generated by the second software application in response to receiving the event data can be stored in a second data store.

At 810, it is determined whether new second data is available. If yes, methodology 800 returns to 808. If no, methodology 800 proceeds to 812.

At 812, a first check value for the first data stored in the first data store and a second check value for the second data stored in the second data store is compared by the system (e.g., by comparison component 106). The first check value can be a condensed representation of the first data that uniquely represents the first data. In one example, the first check value can be equal to a remainder of a polynomial division of content included in the first data. Similarly, the second check value can be, for example, a condensed representation of the second data that uniquely represents the second data. In one example, the second check value can be equal to a remainder of a polynomial division of content included in the second data. In an aspect, bits values for the first check value and bit values for the second check value can be compared. In an embodiment, the first check value and the second check value can be compared based on a distance metric. For example, the first check value and the second check value can be compared based on a Hamming distance. In another example, the first check value and the second check value can be compared based on a Jaccard distance. In an embodiment, the first check value and the second check value can be compared in response to a determination that the first data value satisfies a defined criterion associated with an amount of time that the first data value is stored in the first data store and/or an amount of time that the second data value is stored in the second data store.

At 814, the event executed by the first software application and the second software application is re-initiated, by the system (e.g., by mitigation component 108) in response to a determination that the first check value does not correspond to the second check value. For example, input data previously provided to the first software application and the second software application to execute the event can be provided to the first software application and the second software application again in response to a determination that the first check value does not correspond to the second check value.

In certain embodiments, the methodology 800 can further include storing, by the system, third data associated with the first software application in the first data store in response to the re-initiating the event. Additionally or alternatively, the methodology 800 can further include storing, by the system, fourth data associated with the second software application in the second data store in response to the re-initiating the event. In an embodiment, the methodology 800 can further include comparing, by the system, a third check value for the third data stored in the first data store and a fourth check value for the fourth data stored in the second data store. In certain embodiments, the methodology 800 can further include comparing, by the system, a third check value for the third data stored in the first data store and a fourth check value for the fourth data stored in the second data store. In another embodiment, the methodology 800 can further include maintaining, by the system, the third data in the first data store and the fourth data in the second data store in response to a determination that the third check value corresponds to the fourth check value. In another embodiment, the methodology 800 can further include altering, by the system, a state of hardware associated with the event in response to a determination that the third check value does not correspond to the fourth check value.

Referring to FIG. 9, there illustrated is a methodology 900 for mitigating memory events in redundant software installations, according to an aspect of the subject innovation. As an example, the methodology 900 can be utilized in various applications, such as, but not limited to, aviation systems, industrial systems, manufacturing systems, factory systems, energy management systems, power grid systems, water supply systems, transportation systems, healthcare systems, refinery systems, media systems, research systems, financial systems, data-driven prognostics systems, machine learning systems, neural network systems, network systems, computer network systems, communication systems, router systems, server systems, high availability server systems (e.g., Telecom server systems), Web server systems, file server systems, data server systems, disk array systems, powered insertion board systems, cloud-based systems, etc. At 902, start of event processing on a first software application and a second software application is synchronized (e.g., by event component 104). At 904, first data is generated, using the first software application (e.g., first software application $116_i$), by performing a first computation process based on event data. At 906, second data is generated, using the second software application (e.g., second software application $116_N$), by performing a second computation process based on event data. In certain embodiments, 904 and 906 can be performed in parallel. At 908, a first check value for the first data and a second check value for the second data are compared. At 910, it is determined whether the first check value corresponds to the second check value. If no, the methodology 900 returns to 902 to re-initiate the event on the first software application and the second software application. If yes, methodology 900 proceeds to 912. At 912, the first data and/or the second data are provided to memory and/or a processing pipeline. In one example, the first data and/or the second data can be provided to a memory associated with a processing pipeline.

Figure 10:
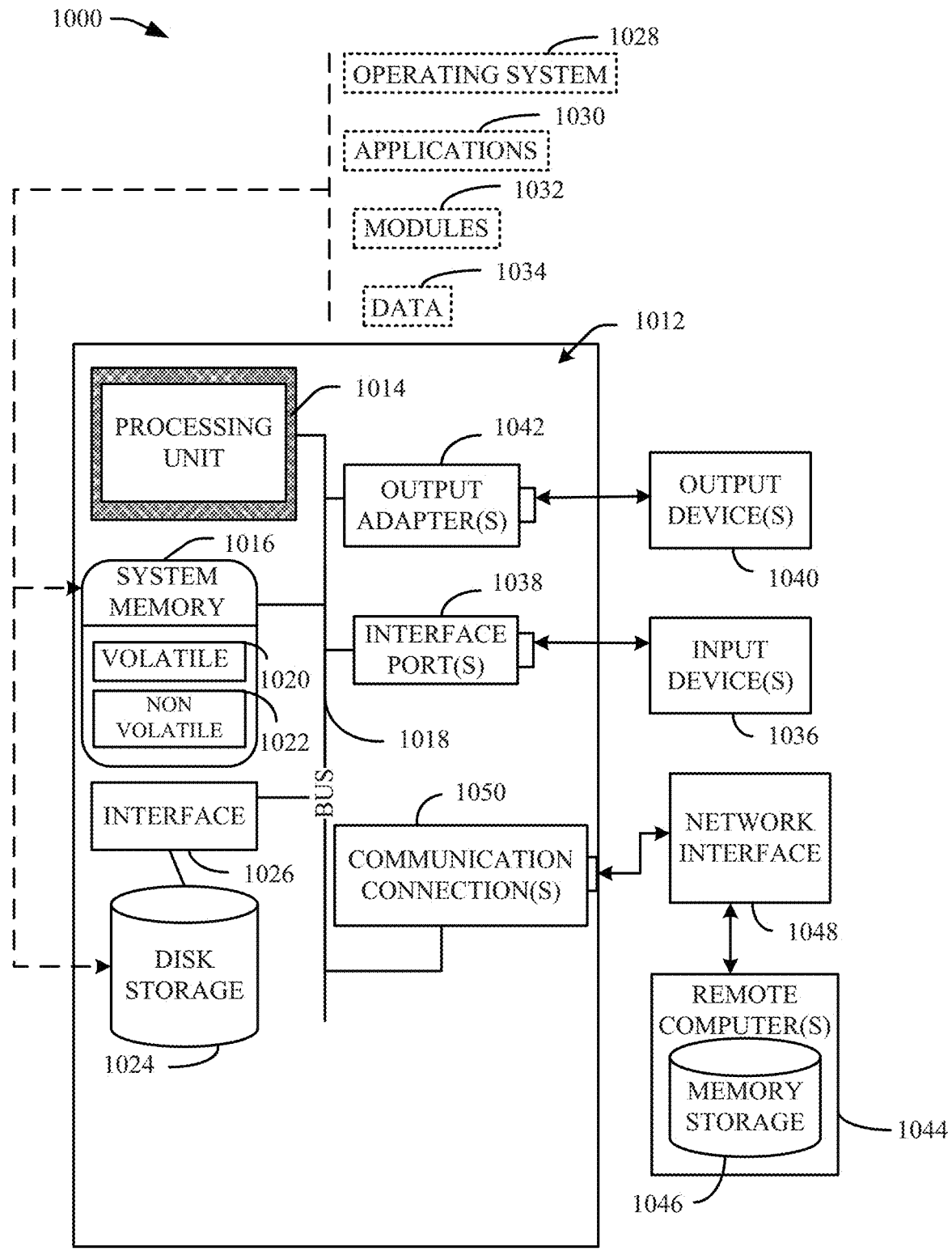
FIG. 10 is a schematic block diagram illustrating a suitable operating environment.
Figure 11:
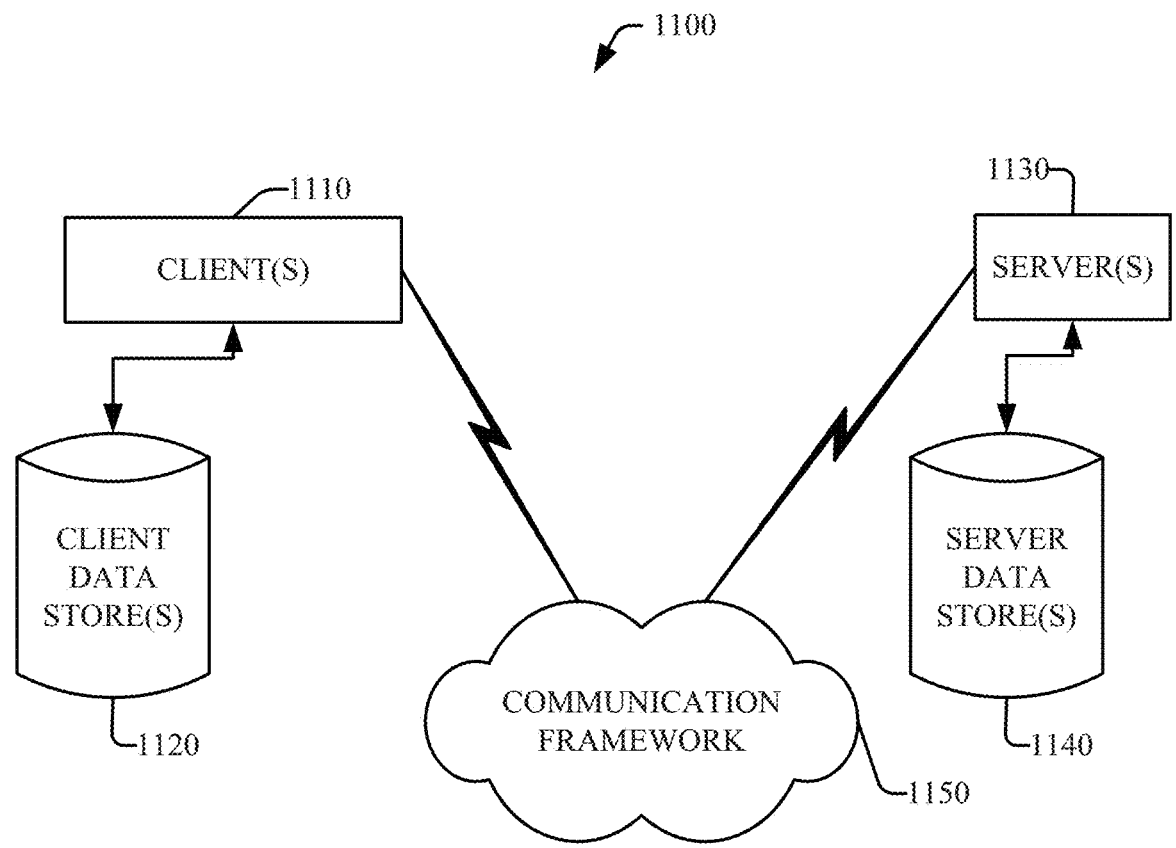
FIG. 11 is a schematic block diagram of a sample-computing environment.

In order to provide a context for the various aspects of the disclosed subject matter, FIGS. 10 and 11 as well as the following discussion are intended to provide a brief, general description of a suitable environment in which the various aspects of the disclosed subject matter may be implemented.

With reference to FIG. 10, a suitable environment 1000 for implementing various aspects of this disclosure includes a computer 1012. The computer 1012 includes a processing unit 1014, a system memory 1016, and a system bus 1018. The system bus 1018 couples system components including, but not limited to, the system memory 1016 to the processing unit 1014. The processing unit 1014 can be any of various available processors. Dual microprocessors and other multiprocessor architectures also can be employed as the processing unit 1014.

The system bus 1018 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1016 includes volatile memory 1020 and nonvolatile memory 1022. The basic input/output system (BIOS), containing the basic routines to transfer information between elements within the computer 1012, such as during start-up, is stored in nonvolatile memory 1022. By way of illustration, and not limitation, nonvolatile memory 1022 can include read only memory (ROM), programmable ROM (PROM), electrically programmable ROM (EPROM), electrically erasable programmable ROM (EEPROM), flash memory, or nonvolatile random access memory (RAM) (e.g., ferroelectric RAM (FeRAM). Volatile memory 1020 includes random access memory (RAM), which acts as external cache memory. By way of illustration and not limitation, RAM is available in many forms such as static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM.

Computer 1012 also includes removable/non-removable, volatile/nonvolatile computer storage media. FIG. 10 illustrates, for example, a disk storage 1024. Disk storage 1024 includes, but is not limited to, devices like a magnetic disk drive, floppy disk drive, tape drive, Jaz drive, Zip drive, LS-100 drive, flash memory card, or memory stick. The disk storage 1024 also can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1024 to the system bus 1018, a removable or non-removable interface is typically used, such as interface 1026.

FIG. 10 also depicts software that acts as an intermediary between users and the basic computer resources described in the suitable operating environment 1000. Such software includes, for example, an operating system 1028. Operating system 1028, which can be stored on disk storage 1024, acts to control and allocate resources of the computer system 1012. System applications 1030 take advantage of the management of resources by operating system 1028 through program modules 1032 and program data 1034, e.g., stored either in system memory 1016 or on disk storage 1024. It is to be appreciated that this disclosure can be implemented with various operating systems or combinations of operating systems.

A user enters commands or information into the computer 1012 through input device(s) 1036. Input devices 1036 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1014 through the system bus 1018 via interface port(s) 1038. Interface port(s) 1038 include, for example, a serial port, a parallel port, a game port, and a universal serial bus (USB). Output device(s) 1040 use some of the same type of ports as input device(s) 1036. Thus, for example, a USB port may be used to provide input to computer 1012, and to output information from computer 1012 to an output device 1040. Output adapter 1042 is provided to illustrate that there are some output devices 1040 like monitors, speakers, and printers, among other output devices 1040, which require special adapters. The output adapters 1042 include, by way of illustration and not limitation, video and sound cards that provide a means of connection between the output device 1040 and the system bus 1018. It should be noted that other devices and/or systems of devices provide both input and output capabilities such as remote computer(s) 1044.

Computer 1012 can operate in a networked environment using logical connections to one or more remote computers, such as remote computer(s) 1044. The remote computer(s) 1044 can be a personal computer, a server, a router, a network PC, a workstation, a microprocessor based appliance, a peer device or other common network node and the like, and typically includes many or all of the elements described relative to computer 1012. For purposes of brevity, only a memory storage device 1046 is illustrated with remote computer(s) 1044. Remote computer(s) 1044 is logically connected to computer 1012 through a network interface 1048 and then physically connected via communication connection 1050. Network interface 1048 encompasses wire and/or wireless communication networks such as local-area networks (LAN), wide-area networks (WAN), cellular networks, etc. LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1050 refers to the hardware/software employed to connect the network interface 1048 to the bus 1018. While communication connection 1050 is shown for illustrative clarity inside computer 1012, it can also be external to computer 1012. The hardware/software necessary for connection to the network interface 1048 includes, for exemplary purposes only, internal and external technologies such as, modems including regular telephone grade modems, cable modems and DSL modems, ISDN adapters, and Ethernet cards.

FIG. 11 is a schematic block diagram of a sample-computing environment 1100 with which the subject matter of this disclosure can interact. The system 1100 includes one or more client(s) 1110. The client(s) 1110 can be hardware and/or software (e.g., threads, processes, computing devices). The system 1100 also includes one or more server(s) 1130. Thus, system 1100 can correspond to a two-tier client server model or a multi-tier model (e.g., client, middle tier server, data server), amongst other models. The server(s) 1130 can also be hardware and/or software (e.g., threads, processes, computing devices). The servers 1130 can house threads to perform transformations by employing this disclosure, for example. One possible communication between a client 1110 and a server 1130 may be in the form of a data packet transmitted between two or more computer processes.

The system 1100 includes a communication framework 1150 that can be employed to facilitate communications between the client(s) 1110 and the server(s) 1130. The client(s) 1110 are operatively connected to one or more client data store(s) 1120 that can be employed to store information local to the client(s) 1110. Similarly, the server(s) 1130 are operatively connected to one or more server data store(s) 1140 that can be employed to store information local to the servers 1130.

It is to be noted that aspects or features of this disclosure can be exploited in substantially any wireless telecommunication or radio technology, e.g., Wi-Fi; Bluetooth; Worldwide Interoperability for Microwave Access (WiMAX); Enhanced General Packet Radio Service (Enhanced GPRS); Third Generation Partnership Project (3GPP) Long Term Evolution (LTE); Third Generation Partnership Project 2 (3GPP2) Ultra Mobile Broadband (UMB); 3GPP Universal Mobile Telecommunication System (UMTS); High Speed Packet Access (HSPA); High Speed Downlink Packet Access (HSDPA); High Speed Uplink Packet Access (HSUPA); GSM (Global System for Mobile Communications) EDGE (Enhanced Data Rates for GSM Evolution) Radio Access Network (GERAN); UMTS Terrestrial Radio Access Network (UTRAN); LTE Advanced (LTE-A); etc. Additionally, some or all of the aspects described herein can be exploited in legacy telecommunication technologies, e.g., GSM. In addition, mobile as well non-mobile networks (e.g., the Internet, data service network such as internet protocol television (IPTV), etc.) can exploit aspects or features described herein.

While the subject matter has been described above in the general context of computer-executable instructions of a computer program that runs on a computer and/or computers, those skilled in the art will recognize that this disclosure also can or may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, hand-held computing devices (e.g., PDA, phone), microprocessor-based or programmable consumer or industrial electronics, and the like. The illustrated aspects may also be practiced in distributed computing environments where tasks are performed by remote processing devices that are linked through a communications network. However, some, if not all aspects of this disclosure can be practiced on stand-alone computers. In a distributed computing environment, program modules may be located in both local and remote memory storage devices.

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component may be, but is not limited to being, a process running on a processor, a processor, an object, an executable, a thread of execution, a program, and/or a computer. By way of illustration, both an application running on a server and the server can be a component. One or more components may reside within a process and/or thread of execution and a component may be localized on one computer and/or distributed between two or more computers.

In another example, respective components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a cloud computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form.

As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

Various aspects or features described herein can be implemented as a method, apparatus, system, or article of manufacture using standard programming or engineering techniques. In addition, various aspects or features disclosed in this disclosure can be realized through program modules that implement at least one or more of the methods disclosed herein, the program modules being stored in a memory and executed by at least a processor. Other combinations of hardware and software or hardware and firmware can enable or implement aspects described herein, including a disclosed method(s). The term "article of manufacture" as used herein can encompass a computer program accessible from any computer-readable device, carrier, or storage media. For example, computer readable storage media can include but are not limited to magnetic storage devices (e.g., hard disk, floppy disk, magnetic strips . . . ), optical discs (e.g., compact disc (CD), digital versatile disc (DVD), blu-ray disc (BD) . . . ), smart cards, and flash memory devices (e.g., card, stick, key drive . . . ), or the like.

As it is employed in the subject specification, the term "processor" can refer to substantially any computing processing unit or device comprising, but not limited to, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions described herein. Further, processors can exploit nano-scale architectures such as, but not limited to, molecular and quantum-dot based transistors, switches and gates, in order to optimize space usage or enhance performance of user equipment. A processor may also be implemented as a combination of computing processing units.

In this disclosure, terms such as "store," "storage," "data store," data storage," "database," and substantially any other information storage component relevant to operation and functionality of a component are utilized to refer to "memory components," entities embodied in a "memory," or components comprising a memory. It is to be appreciated that memory and/or memory components described herein can be either volatile memory or nonvolatile memory, or can include both volatile and nonvolatile memory.

By way of illustration, and not limitation, nonvolatile memory can include read only memory (ROM), programmable ROM (PROM), electrically programmable ROM (EPROM), electrically erasable ROM (EEPROM), flash memory, or nonvolatile random access memory (RAM) (e.g., ferroelectric RAM (FeRAM). Volatile memory can include RAM, which can act as external cache memory, for example. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), direct Rambus RAM (DRRAM), direct Rambus dynamic RAM (DRDRAM), and Rambus dynamic RAM (RDRAM). Additionally, the disclosed memory components of systems or methods herein are intended to include, without being limited to including, these and any other suitable types of memory.

It is to be appreciated and understood that components, as described with regard to a particular system or method, can include the same or similar functionality as respective components (e.g., respectively named components or similarly named components) as described with regard to other systems or methods disclosed herein.

What has been described above includes examples of systems and methods that provide advantages of this disclosure. It is, of course, not possible to describe every conceivable combination of components or methods for purposes of describing this disclosure, but one of ordinary skill in the art may recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim.

What is claimed is:

1. A system, comprising:
   a memory that stores computer executable components;
   a processor that executes the computer executable components stored in the memory, wherein the computer executable components comprise:
   an event component that initiates an event executed by a first software application and a second software application that corresponds to the first software application, wherein the event component stores first data associated with the first software application in a first data store and stores second data associated with the second software application in a second data store;
   a comparison component that compares a first check value for the first data associated with the event and a second check value for the second data associated with the event based on a first determination that at least one of the first data or the second data are not frequently updated; and
   a mitigation component that re-initiates the event executed by the first software application and the second software application in response to a second determination that the first check value does not correspond to the second check value.

2. The system of claim 1, wherein, in response to re-initiation of the event, the event component stores third data associated with the first software application in the first data store and stores fourth data associated with the second software application in the second data store.

3. The system of claim 2, wherein the comparison component compares a third check value for the third data associated with the re-initiation of the event and a fourth check value for the fourth data associated with the re-initiation of the event.

4. The system of claim 3, wherein the mitigation component maintains the third data in the first data store and the fourth data in the second data store in response to a third determination that the third check value corresponds to the fourth check value.

5. The system of claim 3, wherein the mitigation component alters a state of hardware associated with the event in response to a third determination that the third check value does not correspond to the fourth check value.

6. The system of claim 1, wherein the comparison component compares the first check value and the second check value in response to a third determination that the first data value satisfies a defined criterion associated with an amount of time that the first data value is stored in the first data store.

7. The system of claim 1, wherein the event is executed by the first software application and the second software application based on input data, and wherein the mitigation component provides the input data to the first software application and the second software application in response to the second determination that the first check value does not correspond to the second check value.

8. The system of claim 1, wherein the mitigation component corrects a single event upset for hardware associated with the event in response to the second determination that the first check value does not correspond to the second check value.

9. The system of claim 1, wherein the event component synchronizes start of event processing on the first software application and the second software application.

10. A method, comprising:
    providing, by a system comprising a processor, event data that initiates execution of an event to a first software application and a second software application that corresponds to the first software application;

storing, by the system, first data associated with the first software application in a first data store;

storing, by the system, second data associated with the second software application in a second data store;

determining, by the system, that the first data has been stored in the first data store for a defined amount of time;

comparing, by the system, a first check value for the first data stored in the first data store and a second check value for the second data stored in the second data store; and re-initiating, by the system, the event executed by the first software application and the second software application in response to a determination that the first check value does not correspond to the second check value.

11. The method of claim 10, further comprising:

storing, by the system, third data associated with the first software application in the first data store in response to the re-initiating the event.

12. The method of claim 11, further comprising:

storing, by the system, fourth data associated with the second software application in the second data store in response to the re-initiating the event.

13. The method of claim 12, further comprising:

comparing, by the system, a third check value for the third data stored in the first data store and a fourth check value for the fourth data stored in the second data store.

14. The method of claim 13, wherein the determination that the first check value does not correspond to the second check value is a first determination, and wherein the method further comprising:

maintaining, by the system, the third data in the first data store and the fourth data in the second data store in response to a second determination that the third check value corresponds to the fourth check value.

15. The method of claim 13, wherein the determination that the first check value does not correspond to the second check value is a first determination, and wherein the method further comprising:

altering, by the system, a state of hardware associated with the event in response to a second determination that the third check value does not correspond to the fourth check value.

16. The method of claim 10, wherein the determination that the first check value does not correspond to the second check value is a first determination, and wherein the comparing comprises comparing the first check value and the second check value in response to a second determination that the first data value satisfies a defined criterion associated with an amount of time that the first data value is stored in the first data store.

17. A non-transitory computer readable storage device comprising instructions that, in response to execution, cause a system comprising a processor to perform operations, comprising:

providing event data that initiates execution of an event to a first software application associated with first hardware a second software application associated with second hardware;

receiving first data generated by the first software application and second data generated by the second software application;

determining the first data has not been re-computed during a defined amount of time;

comparing a first check value for the first data associated with the event and a second check value for the second data associated with the event; and re-initiating the event executed by the first software application and the second software application in response to a determination that the first check value does not correspond to the second check value.

18. The non-transitory computer readable storage device of claim 17, wherein the operations further comprise:

receiving, in response to the re-initiating the event, third data generated by the first software application and fourth data generated by the second software application; and comparing a third check value for the third data associated with the re-initiating the event and a fourth check value for the fourth data associated with the re-initiating the event.

19. The non-transitory computer readable storage device of claim 18, wherein the determination that the first check value does not correspond to the second check value is a first determination, and wherein the operations further comprise:

providing the third data and the fourth data to a memory associated with a processing pipeline in response to a second determination that the third check value corresponds to the fourth check value.

20. The non-transitory computer readable storage device of claim 18, wherein the determination that the first check value does not correspond to the second check value is a first determination, and wherein the operations further comprise:

altering a state of the first hardware or the second hardware in response to a second determination that the third check value does not correspond to the fourth check value.

* * * * *